United States Patent
Eckberg et al.

(10) Patent No.: US 9,631,880 B2
(45) Date of Patent: Apr. 25, 2017

(54) PROCESS FOR OPTIMIZING A HEAT EXCHANGER CONFIGURATION

(75) Inventors: Eric A. Eckberg, Rochester, MN (US); Howard V. Mahaney, Jr., Cedar Park, TX (US); William M. Megarity, Roxboro, NC (US); Roger R. Schmidt, Poughkeepsie, NY (US); Tejas Shah, Austin, TX (US); Scott A. Shurson, Mantorville, MN (US)

(73) Assignee: LENOVO ENTERPRISE SOLUTIONS (SINGAPORE) PTE. LTD., Singapore (SG)

( * ) Notice: Subject to any disclaimer, the term of this patent is extended or adjusted under 35 U.S.C. 154(b) by 927 days.

(21) Appl. No.: 13/443,094

(22) Filed: Apr. 10, 2012

(65) Prior Publication Data

US 2013/0264027 A1    Oct. 10, 2013

(51) Int. Cl.
*F28F 9/007*    (2006.01)
*F28F 27/00*    (2006.01)
*H05K 7/20*    (2006.01)

(52) U.S. Cl.
CPC ......... *F28F 27/00* (2013.01); *H05K 7/20836* (2013.01); *F28F 2200/00* (2013.01)

(58) Field of Classification Search
CPC ...... F28F 13/00; F28F 9/02; F28F 9/00; F28F 9/007; F28F 13/06; H05K 7/18;
(Continued)

(56) References Cited

U.S. PATENT DOCUMENTS 1,073,746 A  *  9/1913  Dwyer ............... F28F 13/06
                                                    165/146
1,674,850 A  *  6/1928  Bogardus ............. F28B 1/00
                                                    165/146
(Continued)

FOREIGN PATENT DOCUMENTS

DE          3318429     *  11/1984   ............. F25B 39/02

OTHER PUBLICATIONS

DE3318429—Machine Translation.*
(Continued)

*Primary Examiner* — Len Tran
*Assistant Examiner* — Gustavo Hincapie Serna
(74) *Attorney, Agent, or Firm* — Kunzler Law Group

(57) ABSTRACT

A heat exchanger door and heat exchanger core optimization method are provided. The door resides at an air inlet or outlet side of an electronics rack, and includes an air-to-coolant heat exchanger with a heat exchanger core. The core includes a first coolant channel coupled to a coolant inlet manifold downstream from a second coolant channel, and the first channel has a shorter channel length than the second channel. Further, coolant channels of the core are coupled to provide counter-flow cooling of an airflow passing across the core. The core optimization method determines at least one combination of parameters that optimize for a particular application at least two performance metrics of the heat exchanger. This method includes obtaining performance metrics for boundary condition(s) of possible heat exchanger configurations with different variable parameters to deter-
(Continued)

mine a combination of parameters that optimize the performance metrics for the heat exchanger.

16 Claims, 27 Drawing Sheets

(58) Field of Classification Search
CPC .... H05K 7/20; H05K 7/20554; F28D 1/0435; F28D 1/0477; F28D 1/0452; F28D 7/1615; F28D 7/1623; F28D 7/163; F28D 7/1638; F25B 39/02; F25B 39/04; F28B 1/02
USPC ... 165/67, 80.5, 104.34, 144, 145, 150, 174, 165/146; 361/699; 62/259.2
See application file for complete search history.

(56) References Cited

U.S. PATENT DOCUMENTS

| | | | |
|---|---|---|---|
| 2,124,291 A * | 7/1938 | Fleisher | F24F 3/14 165/101 |
| 2,278,086 A | 3/1942 | Lea | |
| 2,835,479 A * | 5/1958 | Guarraia | F22B 21/343 122/476 |
| 3,030,782 A * | 4/1962 | Karmazin | F25B 39/028 165/149 |
| 3,209,820 A * | 10/1965 | Lauterbach | 165/174 |
| 4,011,905 A | 3/1977 | Millard | |
| 4,330,034 A * | 5/1982 | Lang | F22B 37/74 165/113 |
| 4,344,482 A * | 8/1982 | Dietzsch | F25B 39/04 165/150 |
| 4,554,968 A * | 11/1985 | Haas | F25B 39/02 165/125 |
| 4,738,309 A * | 4/1988 | Schilling | F28D 7/08 165/101 |
| 4,901,791 A * | 2/1990 | Kadle | F25B 39/04 165/150 |
| 5,036,909 A * | 8/1991 | Whitehead | F28D 1/0391 165/133 |
| 5,076,353 A * | 12/1991 | Haussmann | F25B 39/04 165/110 |
| 5,187,950 A | 2/1993 | Weldon | |
| 5,219,023 A * | 6/1993 | Kadle | 165/110 |
| 5,467,250 A | 11/1995 | Howard et al. | |
| 5,898,995 A | 5/1999 | Ghodbane | |
| 6,164,369 A | 12/2000 | Stoller | |
| 6,462,944 B1 | 10/2002 | Lin | |
| 6,535,382 B2 | 3/2003 | Bishop et al. | |
| 6,760,221 B2 | 7/2004 | Goth et al. | |
| 6,775,137 B2 | 8/2004 | Chu et al. | |
| 6,819,563 B1 | 11/2004 | Chu et al. | |
| 7,074,123 B2 | 7/2006 | Bettridge et al. | |
| 7,086,247 B2 | 8/2006 | Campbell et al. | |
| 7,385,810 B2 | 6/2008 | Chu et al. | |
| 7,403,391 B2 | 7/2008 | Germagian et al. | |
| 7,548,170 B1 | 6/2009 | Griffel | |
| 7,646,603 B2 | 1/2010 | Bard et al. | |
| 7,676,909 B2 | 3/2010 | MacKenzie et al. | |
| 7,830,657 B2 | 11/2010 | Chu et al. | |
| 7,963,118 B2 | 6/2011 | Porter et al. | |
| 8,031,468 B2 * | 10/2011 | Bean et al. | 361/696 |
| 8,113,009 B2 | 2/2012 | Kuriyama et al. | |
| 8,453,713 B2 | 6/2013 | Delia et al. | |
| 2004/0177948 A1 | 9/2004 | Cho et al. | |
| 2004/0182548 A1 * | 9/2004 | Lovette et al. | 165/103 |
| 2005/0092472 A1 * | 5/2005 | Lewis | F28D 1/0435 165/145 |
| 2005/0231913 A1 | 10/2005 | Malone et al. | |
| 2005/0243514 A1 | 11/2005 | Malone et al. | |
| 2006/0141921 A1 | 6/2006 | Turek et al. | |
| 2006/0232945 A1 | 10/2006 | Chu et al. | |
| 2008/0068798 A1 | 3/2008 | Hendrix et al. | |
| 2008/0112128 A1 | 5/2008 | Holland | |
| 2008/0245083 A1 | 10/2008 | Tutunoglu | |
| 2008/0273306 A1 | 11/2008 | Campbell | |
| 2008/0307806 A1 | 12/2008 | Campbell | |
| 2009/0207567 A1 | 8/2009 | Campbell | |
| 2009/0225513 A1 * | 9/2009 | Correa | H05K 7/20781 361/700 |
| 2009/0262501 A1 | 10/2009 | Claassen | |
| 2011/0051372 A1 * | 3/2011 | Barringer et al. | 361/701 |
| 2011/0303394 A1 * | 12/2011 | Branton | 165/104.33 |
| 2012/0300398 A1 | 11/2012 | Eckberg et al. | |
| 2013/0021746 A1 | 1/2013 | Campbell et al. | |
| 2013/0263450 A1 | 10/2013 | Eckberg et al. | |
| 2013/0264024 A1 | 10/2013 | Eckberg et al. | |
| 2013/0264026 A1 | 10/2013 | Eckberg et al. | |
| 2013/0264030 A1 | 10/2013 | Eckberg et al. | |
| 2013/0265719 A1 | 10/2013 | Eckberg et al. | |

OTHER PUBLICATIONS

Eckberg et al., Notice of Allowance for U.S. Appl. No. 13/443,084, filed Apr. 10, 2012 (U.S. Patent Publication No. 2013/0264030 A1), dated Nov. 26, 2013 (24 pages).
Eckberg et al., Notice of Allowance for U.S. Appl. No. 775,610, filed Feb. 25, 2013 (U.S. Patent Publication No. 2013/0265719 A1), dated Nov. 27, 2013 (23 pages).
"RackCooler—A Cool Solution for X-Treme Density Rack Enclosure Systems", Liebert Corporation, Product Brochure, 8 pages (2001).
Teague, Paul E. "One Cool Machine", Design News for Mechanical and Design Engineers, Internet Article, 6 pages (Feb. 7, 2005).
Chu et al., Office Action for U.S. Appl. No. 11/108,306 (U.S. Pat. No. 8,385,810 B2), dated Sep. 20, 2007.
Chu et al., Notice of Allowance for U.S. Appl. No. 11/108,306 (U.S. Pat. No. 8,385,810 B2), dated Apr. 14, 2008.
Chu et al., Notice of Allowance for U.S. Appl. No. 12/131,301 (U.S. Pat. No. 7,830,657 B2), dated Jul. 21, 2010.
Porter et al., Office Action for U.S. Appl. No. 11/860,634 (U.S. Pat. No. 7,963,118 B2), dated Oct. 8, 2010.
Porter et al., Notice of Allowance for U.S. Appl. No. 11/860,634 (U.S. Pat. No. 7,963,118 B2), dated Feb. 14, 2011.
Liebert (R) Corporation, "RackCooler (TM)—A Cool Solution for X-Treme Density Rack Enclosure Systems", Product Brochure, 8 pages (2001) (No further date information available. Note that the date of publication is sufficiently older than the earliest priority date of the application, that the month of publication is not an issue.).
Technology Brief, Optimizing facility in high density data center environments, Aug. 2007, HP pp. 1-26.
Jain et al. Optimization of Heat Exchanger Design Parameters for Hydrocarbon Refrigerant Systems, Sep. 2004 University of Illinois, pp. 1-55.
U.S. Appl. No. 13/775,648, filed Feb. 25, 2013, Office Action mailed Dec. 23, 2015.
U.S. Appl. No. 13/775,648, filed Feb. 25, 2013, Notice of Allowance mailed Apr. 5, 2016.

* cited by examiner

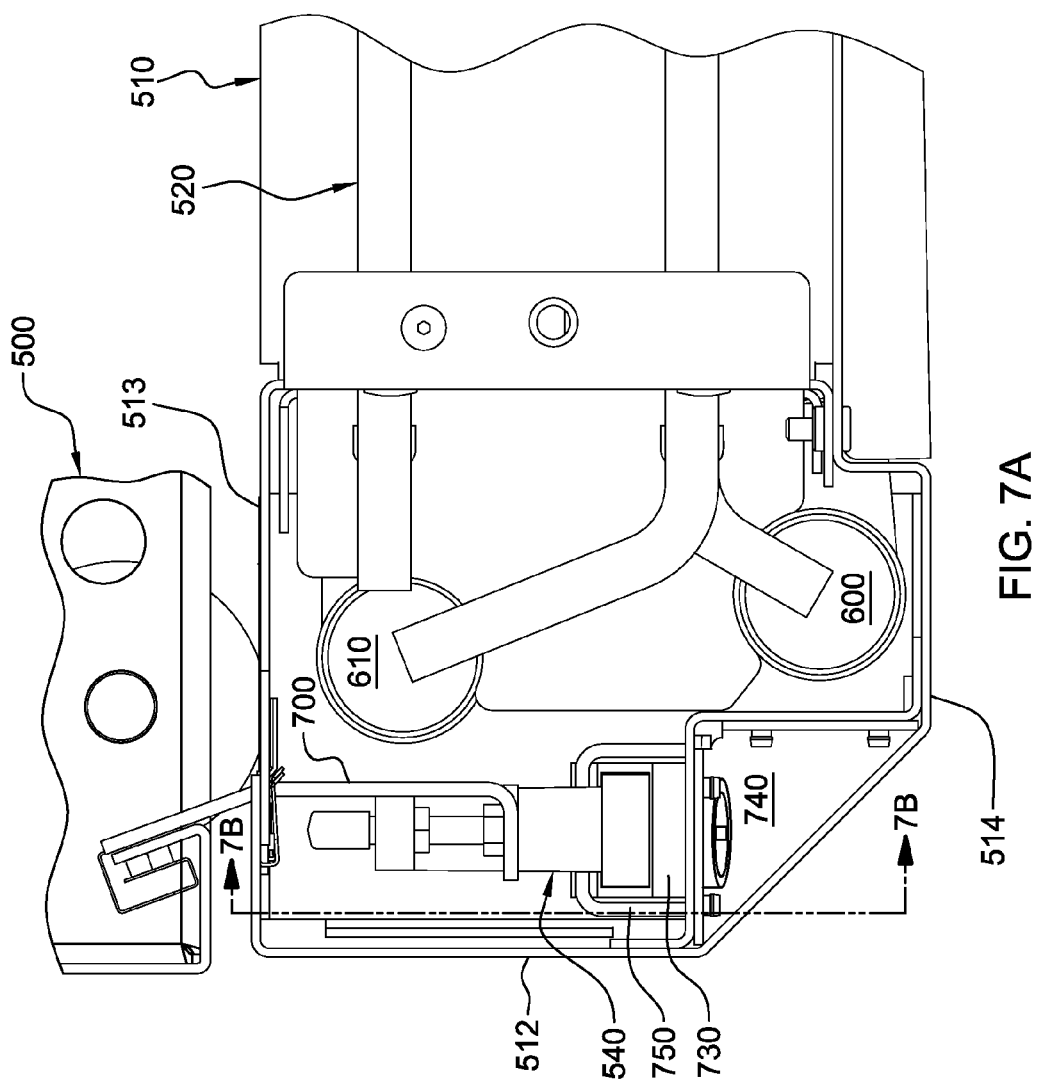

PROCESS FOR OPTIMIZING A HEAT EXCHANGER CONFIGURATION

BACKGROUND

The power dissipation of integrated circuit chips, and the modules containing the chips, continues to increase in order to achieve increases in processor performance. This trend poses a cooling challenge at both module and system levels. Increased airflow rates are needed to effectively cool high-powered modules, and to limit the temperature of the air that is exhausted into the computer center.

In many large server applications, processors, along with their associated electronics (e.g., memory, disk drives, power supplies, etc.), are packaged in removable drawer configurations stacked within a rack or frame. In other cases, the electronics may be in fixed locations within the rack or frame. Typically, the components are cooled by air moving in parallel airflow paths, usually front-to-back, impelled by one or more air-moving devices (e.g., fans or blowers). In some cases, it may be possible to handle increased power dissipation within a single drawer by providing greater airflow, through the use of a more powerful air-moving device, or by increasing the rotational speed (i.e., RPMs) of an existing air-moving device.

The sensible heat load carried by the air exiting the rack is stressing the capability of the room air-conditioning to effectively handle the load. This is especially true for large installations with "server farms", or large banks of computer racks close together. In such installations, liquid-cooling (e.g., water-cooling) is an attractive technology to manage the higher heat fluxes. The liquid absorbs the heat dissipated by the components/modules in an efficient manner. Typically, the heat is ultimately transferred from the liquid to an outside environment.

BRIEF SUMMARY

The shortcomings of the prior art are overcome and additional advantages are provided through the provision of a method, which includes: determining at least one combination of parameters that optimizes at least two performance metrics of a heat exchanger. The determining includes: ascertaining at least two variable parameters of the heat exchanger; ascertaining at least one boundary condition for the heat exchanger; obtaining, by at least one processor, at least two performance metrics for the at least one boundary condition for at least two possible heat exchanger configurations of the heat exchanger that include different combinations of the at least two variable parameters; and using the at least one processor in determining which of the at least two possible heat exchanger configurations optimizes the at least two performance metrics for the at least one boundary condition, the determining facilitating ascertaining at least one combination of the at least two variable parameters that optimizes the at least two performance metrics of the heat exchanger.

In another aspect, a method is provided which includes determining at least one combination of parameters that optimizes performance metrics of an air-to-coolant heat exchanger. The determining includes: ascertaining at least one non-variable parameter and at least two variable parameters of the air-to-coolant heat exchanger; ascertaining at least two boundary conditions for the heat exchanger; obtaining, by at least one processor, at least two performance metrics, for the at least two boundary conditions, of at least two possible heat exchanger configurations that include different combinations of the at least one non-variable parameter and the at least two variable parameters; and using the at least one processor in determining whether a possible heat exchanger configuration of the at least two possible heat exchanger configurations has acceptable performance metrics for the at least two boundary conditions, thereby facilitating determining at least one combination of the at least one non-variable parameter and the at least two variable parameters that provides desired performance metrics, for the at least two boundary conditions, of the air-to-coolant heat exchanger, wherein the at least two performance metrics includes a heat removal rate from airflow across the air-to-coolant heat exchanger and an air side pressure drop across the air-to-coolant heat exchanger.

In a further aspect, an apparatus is provided which includes a heat exchanger door configured to couple to an electronics rack and reside at one of an air inlet side or an air outlet side of the electronics rack. The heat exchanger door includes an airflow opening which facilitates the ingress or egress of airflow through the electronics rack with the heat exchanger door mounted thereto. The heat exchanger door also includes an air-to-coolant heat exchanger disposed so that airflow through the airflow opening passes across the air-to-coolant heat exchanger form a first side to a second side thereof. The air-to-coolant heat exchanger is configured to extract heat from the airflow passing thereacross, and includes a plurality of coolant channels which extend substantially across the airflow opening at least once. The plurality of coolant channels include a first coolant channel coupled to receive coolant from a coolant supply manifold downstream from a second coolant channel receiving coolant from the coolant supply manifold, wherein the channel length of the first coolant channel is less than a channel length of the second coolant channel, and multiple coolant channels of the plurality of coolant channels direct coolant from a channel inlet disposed closer to the second side of the heat exchanger to a channel outlet disposed closer to the first side of the heat exchanger, thereby providing a counter-flow cooling of the airflow.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 7A is a partial cross-sectional plan view of the electronics rack and air-cooling apparatus of FIGS. 5A-6, shown with the heat exchanger door latched to the electronics rack, in accordance with one or more aspects of the present invention;

DETAILED DESCRIPTION

Figure 1:
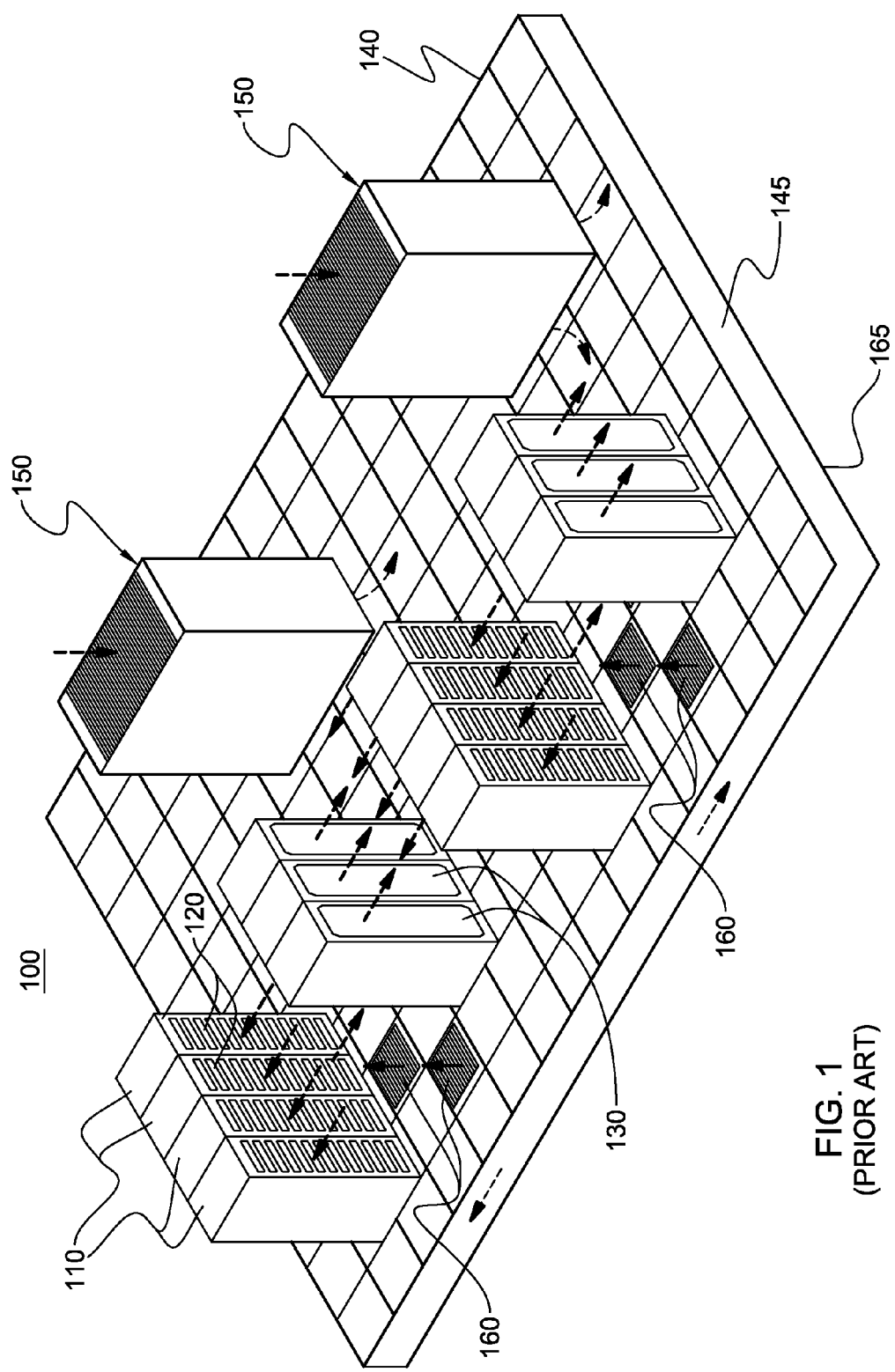
FIG. 1 depicts one embodiment of a raised floor layout of a computer installation capable of being retrofitted with one or more air-cooling apparatuses, in accordance with one or more aspects of the present invention.

As used herein, the terms "electronics rack", "rack unit", and "rack" are used interchangeably, and unless otherwise specified, include any housing, frame, support structure, compartment, blade server system, etc., having one or more heat generating components of a computer system or electronic system, and may be, for example, a stand-alone computer processor having high, mid or low end processing capability. In one embodiment, an electronics rack may comprise a portion of an electronic system, a single electronic system, or multiple electronic systems, for example, in one or more sub-housings, blades, books, drawers, nodes, compartments, etc., having one or more heat-generating electronic components disposed therein. An electronic system within an electronics rack may be movable or fixed relative to the electronics rack, with the rack-mounted electronic drawers of a multi-drawer rack unit and blades of a blade center system being two examples of systems (or subsystems) of an electronics rack to be cooled.

Further, as used herein, "air-to-coolant heat exchanger" means any heat exchange mechanism characterized as described herein through which coolant can circulate; and includes, one or more discrete air-to-coolant heat exchangers coupled either in series or in parallel. An air-to-coolant heat exchanger may comprise, for example, one or more coolant flow paths, formed of thermally conductive tubings (such as copper or other tubing) in thermal or mechanical contact with a plurality of air-cooled cooling fins (such as aluminum or other fins). Unless otherwise specified, size, configuration and construction of the air-to-coolant heat exchanger can vary without departing from the scope of the invention disclosed herein. A "coolant-to-liquid heat exchanger" may comprise, for example, two or more coolant flow paths, formed of thermally conductive tubings (such as copper or other tubing) in thermal or mechanical contact with each other to facilitate conduction of heat therebetween. Size, configuration and construction of the coolant-to-liquid heat exchanger can vary without departing from the scope of the invention disclosed herein. Further, as used herein, "data center" refers to a computer installation containing one or more electronics racks, and as a specific example, a data center may include one or more rows of rack-mounted computing units, such as server units.

One example of facility coolant and system coolant is water. However, the concepts disclosed herein are readily adapted to use with other types of coolant on the facility side and/or on the system side. For example, one or more of the coolants may comprise a water-glycol mixture, a brine, a fluorocarbon liquid, a liquid metal, or other similar coolant, or a refrigerant, while still maintaining the advantages and unique features of the present invention. Further, the term "coolant" refers to any liquid or gas, or combination thereof, used to remove heat, in accordance with the structures and concepts disclosed herein.

Reference is made below to the drawings, which are not drawn to scale to facilitate an understanding of the invention, wherein the same reference numbers used throughout different figures designate the same or similar components.

As shown in FIG. 1, in a raised floor layout of an air cooled computer installation or data center 100, multiple electronics racks 110 may be disposed in one or more rows. A computer installation such as depicted in FIG. 1 may house several hundred, or even several thousand processors. In the arrangement of FIG. 1, chilled air enters the computer room via floor vents from a supply air plenum 145 defined between a raised floor 140 and a base or sub-floor 165 of the room. Cooled air is taken in through louvered covers at the front, or air inlet sides 120, of the electronics racks and expelled through the back, or air outlet sides 130, of the electronics racks. Each electronics rack 110 may have one or more air-moving devices (e.g., fans or blowers) to provide forced inlet-to-outlet airflow to cool the electronic components within the rack. Supply air plenum 145 provides conditioned and cooled air to the air-inlet sides of the electronics racks via perforated floor tiles 160 disposed (in one embodiment) in a "cold" air aisle of the data center. The conditioned and cooled air is supplied to plenum 145 by one or more air-conditioning units 150, which may also be disposed within data center 100. Room air is taken into each air-conditioning unit 150 near an upper portion thereof. In the depicted embodiment, this room air comprises in part exhausted air from the "hot" air aisles of the data center defined by opposing air outlet sides 130 of the electronics racks 110.

Due to ever increasing airflow requirements through electronics racks, and the limits of air distribution within the typical computer room installation, recirculation problems within the room may occur. Recirculation can occur because the conditioned air supplied through the floor tiles may only be a fraction of the airflow rate forced through the electronics racks by the air moving devices disposed within the racks. This can be due, for example, to limitations on the tile sizes (or diffuser flow rates). The remaining fraction of the supply of inlet side air may be made up by ambient room air through recirculation, for example, from the air outlet side of the rack unit to the air inlet side. This recirculating flow is often very complex in nature, and can lead to significantly higher rack inlet temperatures than might be expected.

Recirculation of hot exhaust air from the hot aisle of the computer room installation to the cold aisle can be detrimental to the performance and reliability of the computer system(s) or electronic system(s) within the rack(s). Data center equipment is typically designed to operate with rack air inlet temperatures in the 15-35° C. range. For a raised floor layout such as depicted in FIG. 1, however, temperatures can range from 15-20° C. at the lower portion of the rack, close to the cool air floor vents, to as much as 32-42° C. at the upper portion of the electronics rack, where hot air can form a self-sustaining recirculation loop. Since the allowable rack heat load is limited by the rack inlet air temperature at the "hot" part, this temperature distribution correlates to an inefficient utilization of available air conditioning capability. Computer installation equipment almost always represents a high capital investment to the customer. Thus, it is of significant importance, from a product reliability and performance view point, and from a customer satisfaction and business perspective, to achieve a substantially uniform temperature across the air inlet side of the rack unit.

Figure 2A:
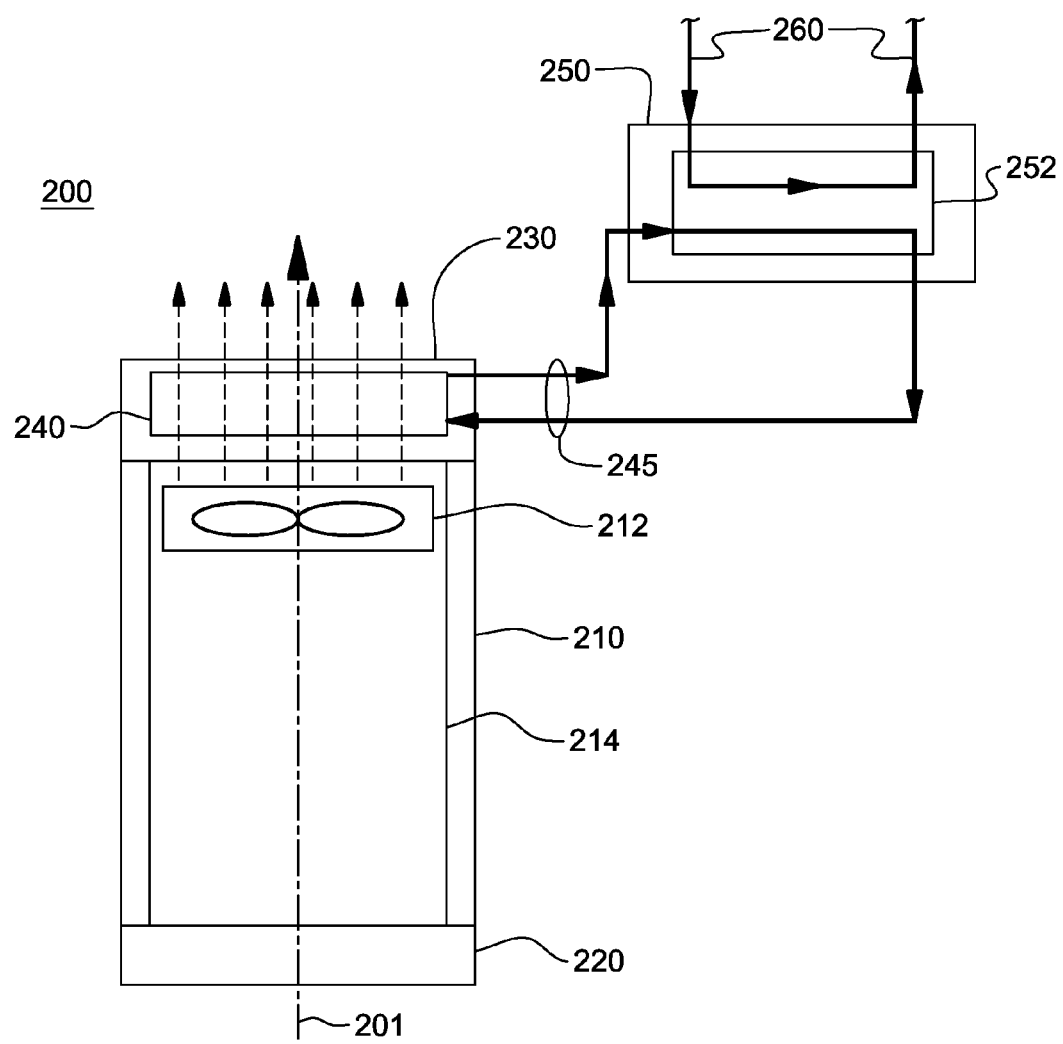
FIG. 2A is a top plan view of one embodiment of an electronics rack with a heat exchanger door mounted to an air outlet side thereof, and with extracted heat being rejected to facility coolant via a coolant distribution unit, in accordance with one or more aspects of the present invention.
Figure 2B:
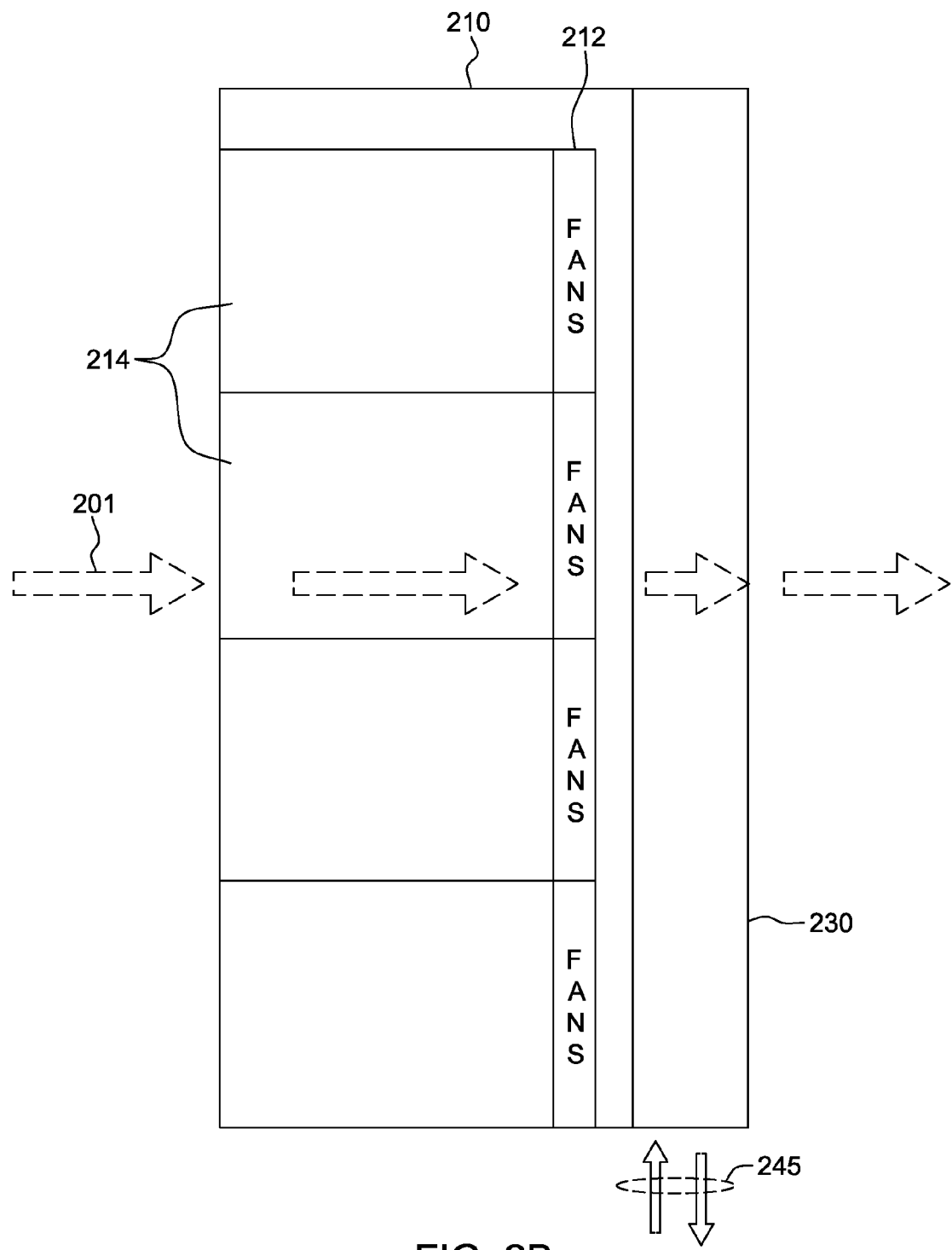
FIG. 2B is a side elevational view of the electronics rack and heat exchanger door of FIG. 2A, in accordance with one or more aspects of the present invention.

Referring collectively to FIGS. 2A & 2B, these figures depict one embodiment of a cooled electronic system, generally denoted 200, which includes an electronics rack 210 having an inlet door 220 and an outlet door 230. The inlet and outlet doors have openings to allow for the ingress and egress of air 201, respectively, through the air inlet side and air outlet side of electronics rack 210. The system further includes at least one air-moving device 212 for moving air across at least one electronic system or component 214 disposed within the electronics rack. Located within outlet door 230 is an air-to-coolant heat exchanger 240 across which the inlet-to-outlet airflow 201 through the electronics rack passes. As shown in FIG. 2A, a system coolant loop 245 couples air-to-coolant heat exchanger 240 to a coolant distribution unit 250. Coolant distribution unit 250 is used to buffer the air-to-coolant heat exchanger from facility coolant in a facility coolant loop 260. Air-to-coolant heat exchanger 240 removes heat from the exhausted inlet-to-outlet airflow 201 through the electronics rack via circulating system coolant, for rejection in coolant distribution unit 250 to facility coolant in facility coolant loop 260, for example, via a coolant-to-liquid heat exchanger 252 disposed therein. By way of example, such a system is described in U.S. Pat. No. 7,385,810 B2, issued Jun. 10, 2008, and entitled "Apparatus and Method for Facilitating Cooling of an Electronics Rack Employing a Heat Exchange Assembly Mounted to an Outlet Door Cover of the Electronics Rack". This cooling apparatus can advantageously reduce heat load on the existing air-conditioning unit(s) within the data center, and facilitates cooling of electronics racks by cooling (in one embodiment) the air egressing from the electronics rack and thus cooling any air recirculating to the air inlet side thereof.

In one implementation, inlet and outlet coolant manifolds of the door-mounted, air-to-coolant heat exchanger are also mounted within the heat exchanger door and are coupled to coolant supply and return lines disposed, for example, beneath a raised floor. Alternatively, overhead system coolant supply and return lines might be provided for the air-to-coolant heat exchangers. In such an embodiment, system coolant would enter and exit the respective coolant inlet and outlet manifolds from the top of the rack door, for example, using flexible coolant supply and return hoses, which may be at least partially looped and sized to facilitate opening and closing of the heat exchanger door. Additionally, structures may be provided at the ends of the hoses to relive stress at the hose ends, which would result from opening or closing of the door.

Figure 3:
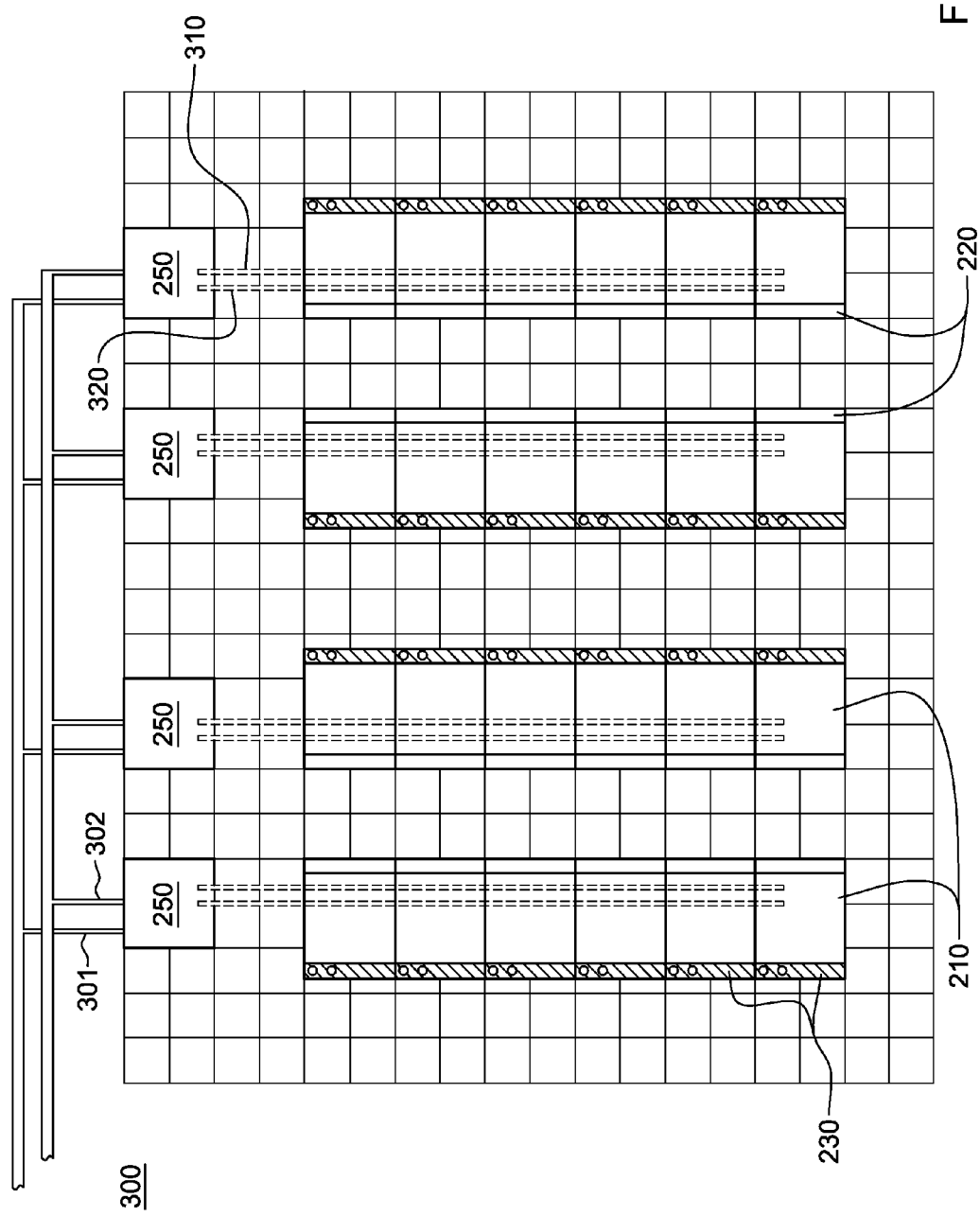
FIG. 3 depicts one embodiment of a data center layout comprising multiple coolant distribution units providing coolant to a plurality of electronics racks with air-cooling apparatuses mounted to at least one of the air inlet sides or air outlet sides thereof, in accordance with one or more aspects of the present invention.

FIG. 3 is a plan view of one embodiment of a data center, generally denoted 300, with cooled electronic systems comprising door-mounted, air-to-coolant heat exchangers, such as disclosed herein. Data center 300 includes a plurality of rows of electronics racks 210, each of which includes (by way of example only) an inlet door 220 at the air inlet side, and a hinged heat exchanger door 230 at the air outlet side, such as described above in connection with the embodiment of FIGS. 2A & 2B. In this embodiment, each heat exchanger door 230 comprises an air-to-coolant heat exchanger and system coolant inlet and outlet manifolds. Multiple coolant conditioning units 250, which function in part as coolant pumping units, are disposed within the data center (possibly along with one or more air-conditioning units (not shown)). By way of example only, each pumping unit may form a system coolant distribution subsystem with one row of a plurality of electronics racks. Each pumping unit includes a coolant-to-liquid heat exchanger where heat is transferred from a system coolant loop to a facility coolant loop. In operation, chilled facility coolant, such as water, is received via a facility coolant supply line 301, and returned via a facility coolant return line 302. System coolant, such as water, is provided via a system coolant supply manifold 310 extending below the respective row of electronics racks, and is returned via a system coolant return manifold 320 also extending below the respective row of electronics racks. In one embodiment, the system coolant supply and return manifolds 310, 320 are hard-plumbed within the data center, for example, within an air supply plenum of the data center, and may be preconfigured to align under and include branch lines (or hoses) extending towards the electronics racks in a respective row of racks.

Figure 4:
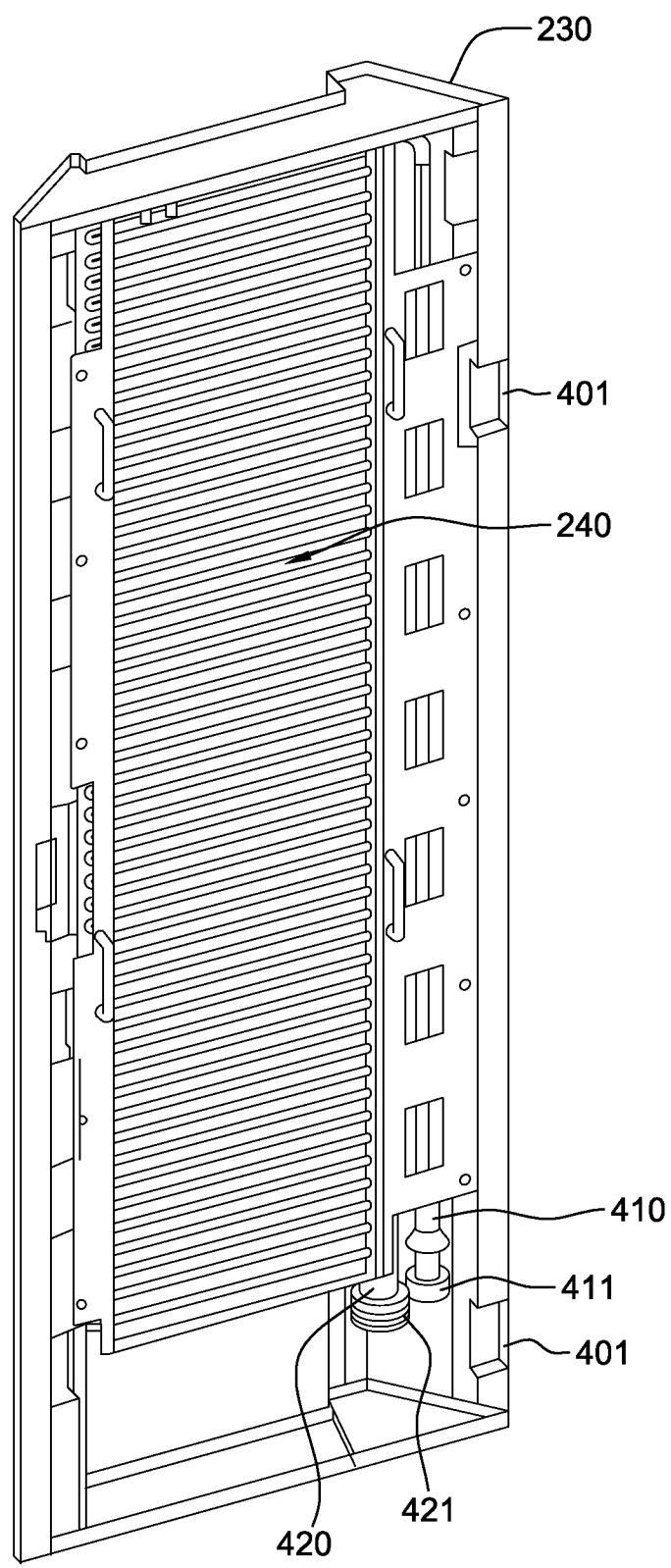
FIG. 4 depicts one implementation of a partially assembled heat exchanger door to be modified, in accordance with one or more aspects of the present invention.

FIG. 4 depicts one version of a heat exchanger door 230 for mounting to the air outlet side of an electronics rack, such as described above in connection with FIGS. 2A-3. This embodiment is described in detail in the above-noted U.S. Pat. No. 7,385,810 B2, and represents one version of an outlet door 230 with an air-to-coolant heat exchanger 240 mounted therein. In this embodiment, a coolant inlet manifold 410 and coolant outlet manifold 420 are provided along a hinge edge 401, which is configured to facilitate hinged mounting of the outlet door to an electronics rack. The coolant inlet and outlet manifolds 410, 420 further include couplings, such as quick connect couplings 411, 421 within the outlet door that are aligned vertically with the coolant inlet and outlet manifolds.

A heat exchanger door, such as depicted in FIG. 4, comprises a cooling device, and replaces (for example) a door of an electronics rack. When incorporated as an outlet door, the heat exchanger door does not provide any direct cooling to the electronic components within the electronics rack, but rather facilitates a reduction in the exhaust air temperature into the data center that may re-circulate to the air inlet side, as well as reduces the heat load to be removed by, for example, the computer room air-conditioning units, and thus, facilitates management of the heat load within the data center. Depending on the implementation, since the temperature of air leaving the electronics rack via a heat exchanger door, such as as disclosed herein, can be as cold as or colder than the air entering the electronics rack, usage of the heat exchanger door proposed herein may decrease or even eliminate the need for computer room air-conditioners within the data center.

Advantages of using a heat exchanger door, especially configured, such as disclosed herein, include: the ability to support a much higher power-rack load than can otherwise be supported by traditional air-cooling of the data center alone, which is generally limited to about 10-15 kW/rack for the majority of data centers; eliminates the uncomfortable hot aisle/cold aisle data center floor configuration; eliminates the need for hot aisle and/or cold aisle containment; has significant energy efficiency, that is, as compared with conventional air-cooling, where the typical air-cooled data center must pay for the electrical power used by the blowers and the computer room air-conditioner to force the chilled air under the floor and through the perforated tiles on the floor, to the inlet sides of the electronics racks; utilizes a coolant (such as water) which can result in a 4× to 10× reduction in the cooling cost of a data center; solves the hot spot issues within a data center due to recirculation of exhaust air; is a passive apparatus, requiring no power at the heat exchanger door, and depending on the implementation, requires no fans or control elements which would need to be purchased or replaced if failed; and creates no extra noise within the data center environment.

In view of the significant importance, from a product reliability and performance viewpoint, and from a customer satisfaction and business perspective, to achieve a substantially uniform temperature across the air inlet side of the electronics rack, disclosed herein are various enhancements to the air-cooling apparatus and heat exchanger door configuration described above in connection with FIGS. 2A-4.

There are two primary objectives in designing a heat exchanger door, which are in opposition to each other. These objectives are:

1. A desire to maximize the amount of heat which can be removed from the air stream. In a simplest form, this can be accomplished by increasing the fin density of the heat exchanger core.
2. A desire to minimize the air-side pressure drop across the heat exchanger. Since in certain embodiments disclosed herein the heat exchanger door does not have any fans of its own, the fans in the existing electronics rack need to provide enough flow to counteract the impedance of airflow through the electronic system(s) (e.g., server(s)), as well as through the heat exchanger door. For a fixed fan speed, the net airflow rate delivered by the fans will decrease as the impedance of the heat exchanger door increases. This decrease in airflow might trigger thermal sensors to signal for more airflow by increasing the speed (RPMs), power consumption, and thus noise of the fans or other air-moving devices. If the air-moving devices are already at their maximum speed, they are unable to increase speed, and increased component temperatures will result. In its simplest form, decreasing the air-side pressure drop of the heat exchanger door can be accomplished by decreasing the fin density of the heat exchanger core. Therefore, maintaining a very low airflow impedance for the heat exchanger door is important to a commercially successful implementation.

Since power consumption continues to dramatically increase within electronics rack, provided herein are various enhancements to the above-described heat exchanger door, which result, for example, in a 2× improvement in heat removal compared to the outlet door version depicted in FIG. 4, without increasing the air-side pressure drop (impedance). Other objectives in designing a heat exchanger door include: minimizing coolant-side flow rate and pressure drop requirements to minimize pumping costs (operating expenses); minimize weight of the door itself, which must be shipped and installed; minimize costs (that is, minimize capital expense); minimize thickness of the door to decrease the footprint of the electronics rack and heat exchanger door together; and ensure flow uniformity across the parallel flow paths through the heat exchanger door.

To achieve the conflicting goals of maximizing heat removal, while maintaining an acceptably low air-side pressure drop, numerous mechanical structural changes are disclosed herein, so as to maximize the height and width of the heat exchanger core to be as close to the height and width of the heat exchanger door as possible. Advantageously, as the core is made wider, a greater fin surface area is achieved, and there is a decrease in the inlet air velocity entering the heat exchanger door, that is, a larger frontal area for the same volumetric flow rate, and hence, a lower air-side pressure drop is achieved. It is also possible to lower the fin density while maintaining the same surface area, and thereby significantly decrease the air-side pressure drop due to the effects of lower inlet velocity and lower fin pitch. With respect to the heat exchanger core, the following dimensions are significant: height of the heat exchanger door; height of the exchanger core itself; unusable height for the heat exchanger core; the width of the electronics rack, and thus (in one embodiment) the width of the heat exchanger door; the width of the heat exchanger core; and the unusable width of the heat exchanger door for the heat exchanger core. Note that as used herein, the heat exchanger core is assumed to have a width and height substantially corresponding to an airflow opening formed within the door frame or assembly of the heat exchanger door. Thus, maximizing the size of the heat exchanger core corresponds, in one embodiment, to maximizing the size of the airflow opening in the door frame.

By way of example, certain mechanical changes disclosed herein may be made to a heat exchanger door configuration, without changing the overall height and width of the door, which advantageously allow for an increase in the heat exchanger core size. Significantly, an increase in the heat exchanger core width by, for example, 52 mm increases the surface area of the heat exchanger, and allows for a significant decrease in fin density while maintaining the same heat removal. Due to the wider core, the average air velocity entering the heat exchanger door also decreases, since there is a larger frontal area for the same volumetric flow rate to, for example, 88% (wherein pressure drop is typically proportional to velocity squared), and the fin density is much lower, creating much less restriction to the airflow. Coupling these effects allows the air-side pressure drop to be decreased by, for example, 45%, which is a dramatic reduction, achieved without changing the overall height and width of the heat exchanger door.

As noted, disclosed herein are numerous structural modifications and enhancements to a heat exchanger door, which are presented with the goal of maximizing the amount of heat which can be removed from the airstream passing through the electronics rack, while minimizing pressure drop across the heat exchanger door. Also, the heat exchanger door disclosed herein may be employed at either the air inlet side or the air outlet side of the electronics rack, or both, with the discussion presented below assuming that the heat exchanger door is mounted to the air outlet side of an electronics rack, again by way of example only.

Note that the air-to-coolant heat exchanger disclosed herein is advantageously designed to function without added air-moving devices within the electronics rack or within the heat exchanger door. Therefore, air impedance of the heat exchanger door is designed to be as low as possible. This is achieved by controlling various design variables discussed herein, including, for example, the number of coolant tubes, and size of coolant tubes employed in the tube sections of the heat exchanger, and the number, configuration, thickness, and depth in the airflow direction of the fins used in the air-to-coolant heat exchanger. Additionally, the air-to-coolant heat exchanger may be designed to operate (in one embodiment) using, for example, above-dew-point coolant, thus eliminating any chance for condensation to occur, and the need for condensation monitoring and draining devices. The materials and wall thicknesses may be chosen to accommodate the air impedance design. Strict brazing processing definition and control may be employed, along with multiple test points in the build process, for robust, controlled component fabrication. In combination, these considerations contribute to ensure a leak-proof, highly reliable product which meets the design objectives.

Ease of installation may be designed into the air-to-coolant heat exchanger and heat exchanger door disclosed herein through the use of a minimal number of parts, and the use of quick connect couplings. For example, after hingedly mounting the heat exchanger door to the electronics rack, supply and return hoses may be coupled to quick connect couplings. Start-up may be completed by initializing the supply coolant, and attaching a bleed tool to an upper bleed valve, that is, until all air is removed from the piping. For purposes of handling and attaching the heat exchanger door, components are designed for reduced weight where possible. For example, a hybrid aluminum door frame can be employed, with steel support plates where needed for structural integrity, to create and provide a door with a high strength-to-weight ratio. In one embodiment, the heat exchange tube section of the air-to-coolant heat exchanger can comprise small diameter tubes, with minimal diameter manifolds being used, in combination with, for example, lightweight fins (such as aluminum fins), for the heat exchange tube sections to provide the highest possible heat removal area, with the lowest possible weight. Safety considerations may also be taken into account throughout the design. For ease of handling, lifting handles may be provided on, for example, the inner side of the heat exchanger door. Further, to protect fins from damage and to protect the operator or bystander from contacting sharp fins, protective perforated plates may be installed across the inner side and/or outer side of the heat exchanger door.

Generally stated, disclosed herein is an air-cooling apparatus which includes a heat exchanger door configured to hingedly mount to one of an air inlet side or an air outlet side of an electronics rack, wherein air moves through the electronics rack from the air inlet side to the air outlet side thereof. The heat exchanger door includes a door frame sized and configured to span at least a portion of the air inlet side or the air outlet side of the electronics rack, and an air-to-coolant heat exchanger supported by the door frame. The door frame includes an airflow opening which facilitates the ingress or egress of airflow through the electronics rack with the heat exchanger door mounted thereto, and the air-to-coolant heat exchanger is configured and disposed so that airflow through the airflow opening passes across the air-to-coolant heat exchanger. The air-to-coolant heat exchanger is configured to extract heat from airflow passing thereacross.

Numerous enhancements to the air-cooling apparatus, including the heat exchanger door, are disclosed herein, including: providing manifold coupled, quick connect couplings within the heat exchanger door at a right angle to vertically-extending coolant inlet and outlet manifolds; providing a door latch mechanism and catch bracket which allows the door latch mechanism to reside entirely within the heat exchanger door; providing an inwardly curved or inwardly angled latch edge on the heat exchanger door, such that the diagonal of the heat exchanger door from the hinge axis to the latch edge is pulled in somewhat; forming the structural door at least partially around the heat exchanger core itself by providing, for example, a beam box or tubular door support structure integrated with a casing of the heat exchanger core such that heat exchanger core bends or turns reside within the tubular door support structure; hinging the heat exchanger door at the outer side of the heat exchanger door, away from the electronics rack to which the heat exchanger door is mounted using, for example, upper and lower hinge brackets, with respective hinge pins extending into the heat exchanger door; designing the heat exchanger door to be symmetrical so that the door can be flipped upside down using the same door latch mechanism position and hinge pins, for example, to allow for coupling of the door to overhead coolant supply and return headers; the use of counter-flow circuits to maximize heat removal from the heat exchanger core, along with numerous heat exchanger core design optimizations and a process for maximizing heat exchanger core design. These and other aspects of the air-cooling apparatus and heat exchanger door described herein, collectively contribute to enlarging the size of the heat exchanger core without changing the overall height or width of the heat exchanger door, and thus to meeting the above-stated goals of maximizing the amount of heat which can be removed from the airstream, while minimizing the air-side pressure drop across the heat exchanger door.

Figure 5A:
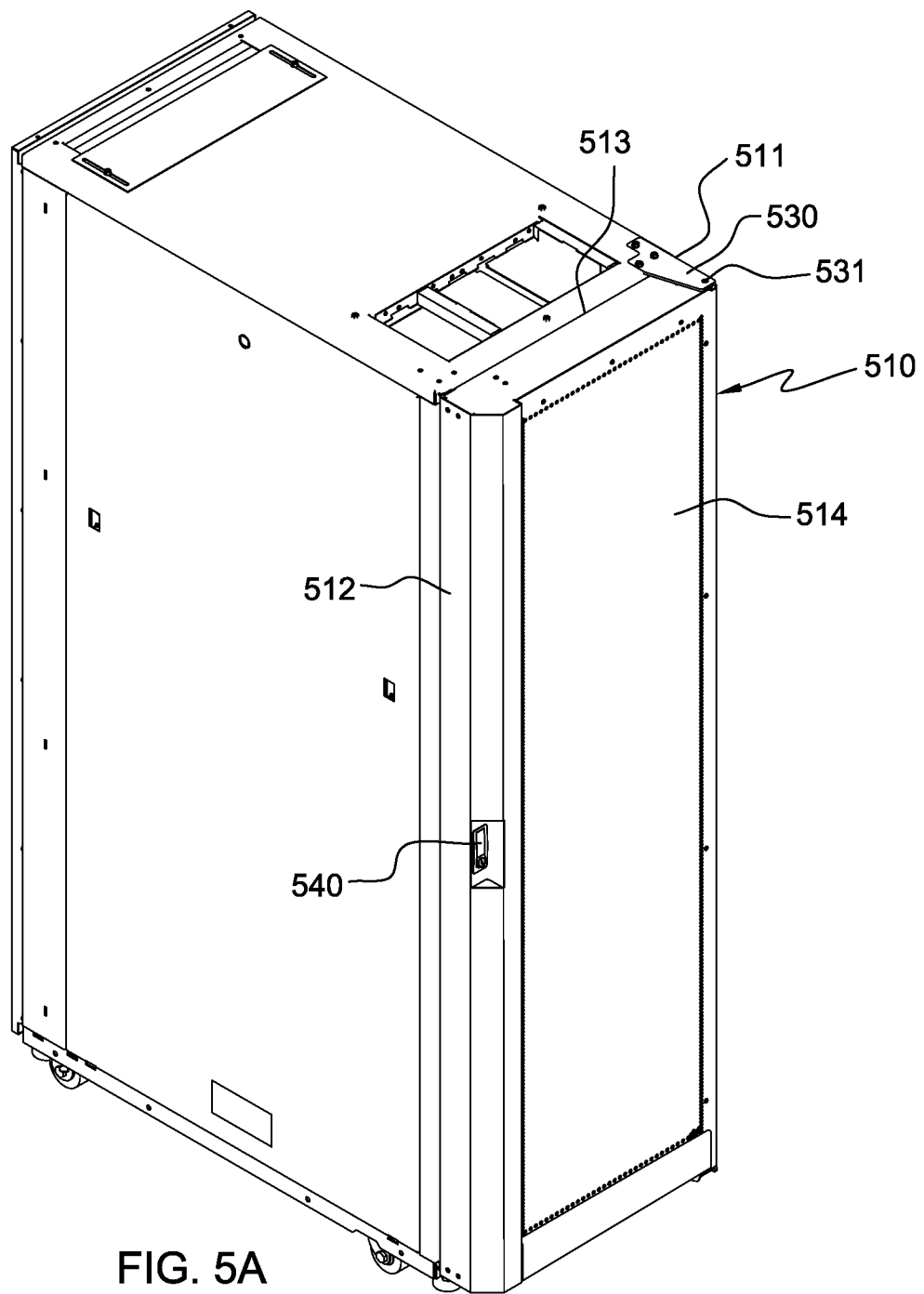
FIG. 5A depicts an electronics rack with an air-cooling apparatus disposed at one of the air outlet side or air inlet side thereof, and with the heat exchanger door shown in a latched position, in accordance with one or more aspects of the present invention.
Figure 5B:
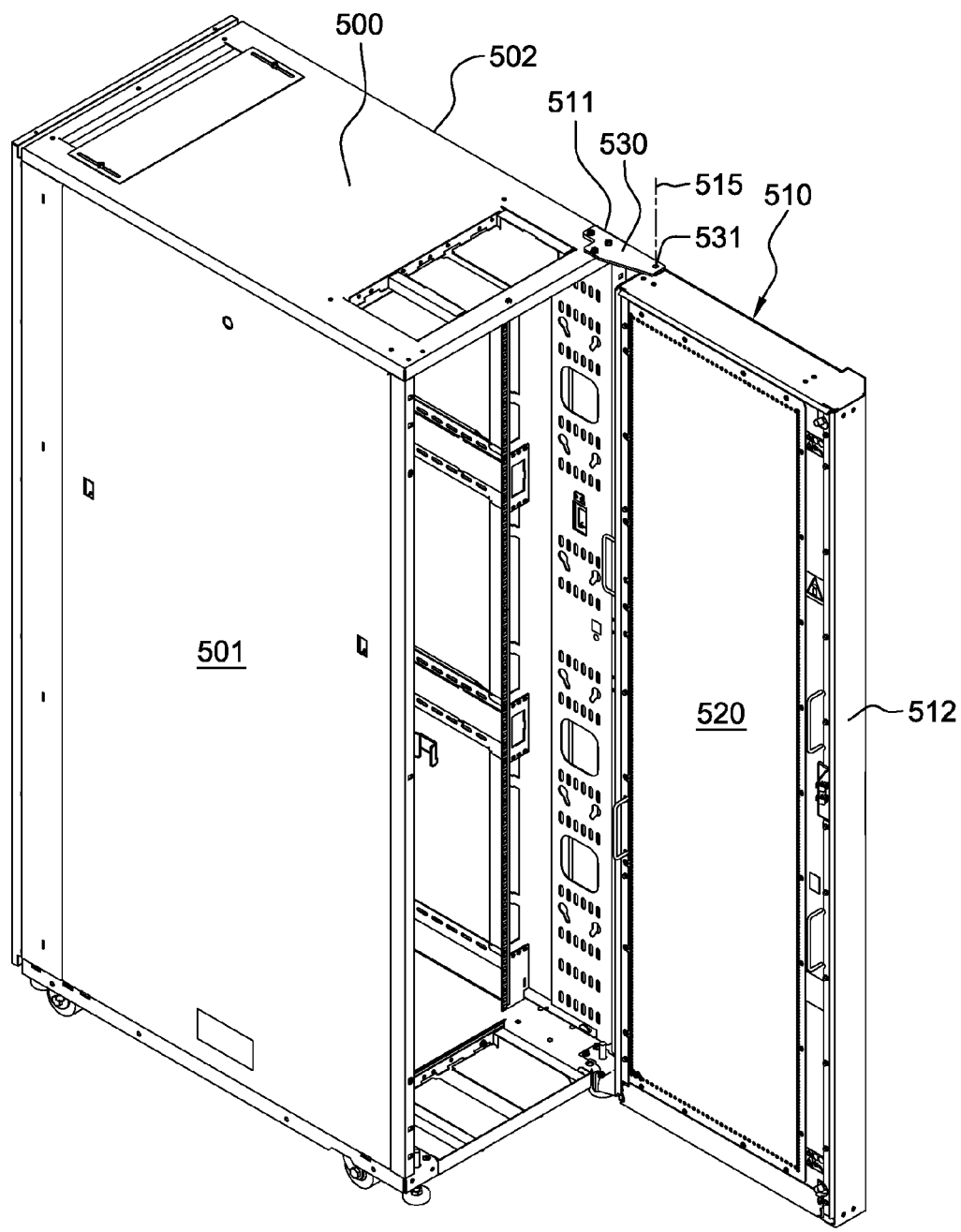
FIG. 5B depicts the electronics rack and air-cooling apparatus of FIG. 5A, with the heat exchanger door shown in an unlatched and open position, in accordance with one or more aspects of the present invention.

FIGS. 5A & 5B depict one embodiment of an assembly comprising a heat exchanger door 510 hingedly mounted at a vertically-extending hinge edge 511 of the heat exchanger door to an electronics rack 500 at, for example, an air outlet side of the electronics rack. Heat exchanger door 510 includes an enlarged air-to-coolant heat exchanger 520 (FIG. 5B) having a larger height and width compared with the air-to-coolant heat exchanger of the outlet door described above in connection with the embodiment of FIG. 4. This is achieved without changing the overall height or width of the door itself, but rather, by reconfiguring the structure of the door and components within the door to accommodate a significantly larger air-to-coolant heat exchanger 520 core footprint. In the embodiment depicted, heat exchanger door 510 includes, in addition to hinge edge 511, a vertically-extending latch edge 512 disposed opposite to hinge edge 511, and an inner side 513 and an outer side 514, which are opposite main sides of the heat exchanger door. In the embodiment depicted, inner side 513 is disposed closer to the air outlet side or air inlet side of electronics rack 500 with heat exchanger door 510 latched to the electronics rack, as illustrated in FIG. 5A. Heat exchanger door 510 mounts, in one embodiment, via top and bottom hinge brackets 530 and hinge pins 531 located at or adjacent to hinge edge 511 of heat exchanger door 510. As illustrated, hinge pins 531 may be positioned close to outer side 514 of heat exchanger door so that the hinge axis 515 is out from the electronics rack to, at least in part, minimize or even eliminate the outward swing of the heat exchanger door past electronics rack sides 501, 502, as heat exchanger door 510 is rotated between open and closed positions. As described further below, a door latch mechanism 540 is disposed (in one embodiment) adjacent to latch edge 512 and is configured to facilitate latching of heat exchanger door 510 to electronics rack 500 when in the closed position (illustrated in FIG. 5A). As noted, perforated screens may be provided at inner side 513 and/or outer side 514 of heat exchanger door 510, if desired.

Figure 6:
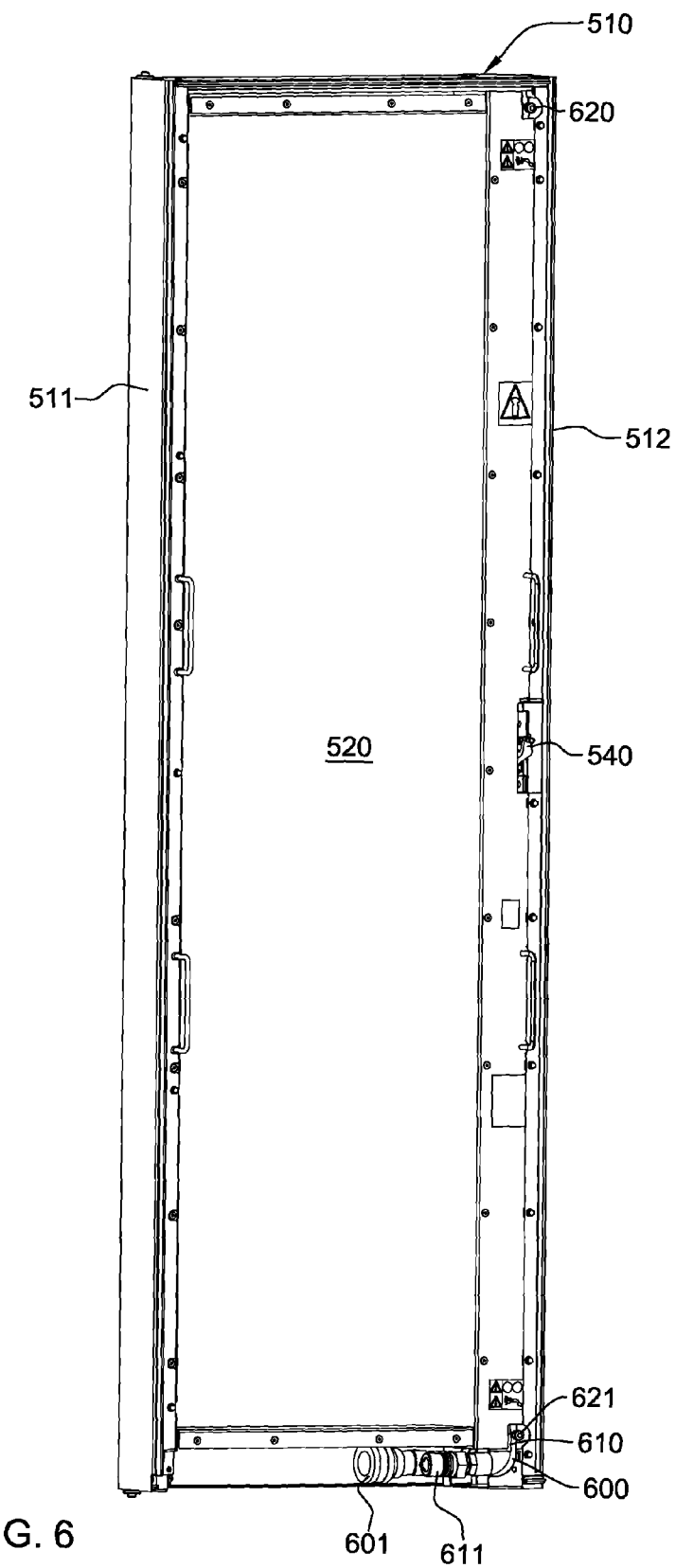
FIG. 6 depicts an inner side, isometric view of one partial embodiment of the heat exchanger door of FIGS. 5A & 5B, in accordance with one or more aspects of the present invention.

FIG. 6 illustrates an inner side, isometric view of a partially assembled heat exchanger door 510, which is shown to include vertically-oriented, coolant inlet and outlet manifolds 600, 610 disposed adjacent to latch edge 512 of the heat exchanger door. In addition, right angle adapters are installed at the ends of the manifolds, with quick connect couplings 601, 611 that facilitate ready attachment of supply and return hoses (not shown) within the bottom of the heat exchanger door to the connects. By way of example, industry standard, hydraulic quick connect couplings may be employed, such as a ¾" quick connect female coupling and a ¾" quick connect male coupling, such as Series-60 general purpose couplings, offered by Parker Hannifin Corporation, of Minneapolis, Minn., USA. The supply and return hoses can pass through bottom openings (not shown) adjacent to the hinge edge 511 of the heat exchanger door, which are configured to accommodate the respective coolant hoses. In one embodiment, the coolant supply and return hoses would connect to coolant supply and return manifolds disposed below a raised floor of the data center, such as described above in connection with FIG. 3.

The heat exchanger core 520 includes a plurality of heat exchange tube sections which couple in fluid communication to coolant inlet manifold 600 and coolant outlet manifold 610. Each heat exchange tube section may includes at least one of a continuous tube or multiple tubes connected together to form, for example, a continuous serpentine cooling channel. In the embodiment shown, each heat exchange tube section may be a continuous tube having a first diameter, and each coolant manifold 600, 610 may be a tube having a second diameter, wherein the second diameter is greater than the first diameter. The first and second diameters are chosen to ensure adequate supply of coolant flow through the multiple heat exchange tube sections. In the embodiment of FIG. 6, the thermally conductive fins attached to the tubes are not illustrated. By way of example, in one embodiment, the plurality of tubes (or tube sections) may extend principally horizontally, and the plurality of thermally conductive fins (not shown) may extend principally vertically.

One or more small air bleed lines and valves 620 may be located at the top of the manifolds. Air bleed tools can be used to capture any exiting coolant during start-up. Another small drain line and valve 621 may be located at a lowest point of the manifold system to facilitate draining the heat exchanger door, if necessary. By way of example, the air bleed valves at the ends of the air bleed lines could comprise Schrader valves, such as those offered by JIB Industries, of Aurora, Ill., USA.

Advantageously, by making a right angle turn from the manifolds, before coupling to the supply and return hoses, horizontally attaching the hoses within the heat exchanger door along the bottom of the heat exchanger door is achieved, which allows the height of the heat exchanger core to come closer to the height of the heat exchanger door itself. This one change may advantageously allow the unusable height of the door for the heat exchanger core to decrease by 50% from, for example, the configuration depicted in FIG. 4.

FIG. 7A is a partial cross-sectional plan view of heat exchanger door 510, and a portion of electronics rack 500, with the heat exchanger door 510 shown in a latched position, secured by door latch mechanism 540 contacting a catch bracket 700. As illustrated, catch bracket 700 is mounted to the electronics rack and sized to extend from the electronics rack into heat exchanger door 510 through a catch opening (not shown) at the inner side 513 of heat exchanger door 510. Note that, in this embodiment, door latch mechanism 540 advantageously resides entirely within the heat exchanger door 510, and that latching to catch bracket 700 occurs within the heat exchanger door itself by the door latch mechanism physically engaging the catch bracket within the door, thereby ensuring latching of the door to the electronics rack. This is contrasted with a conventional rack door latch, which typically extends from the door into the electronics rack in order to engage an element within the electronics rack.

Figure 7C:
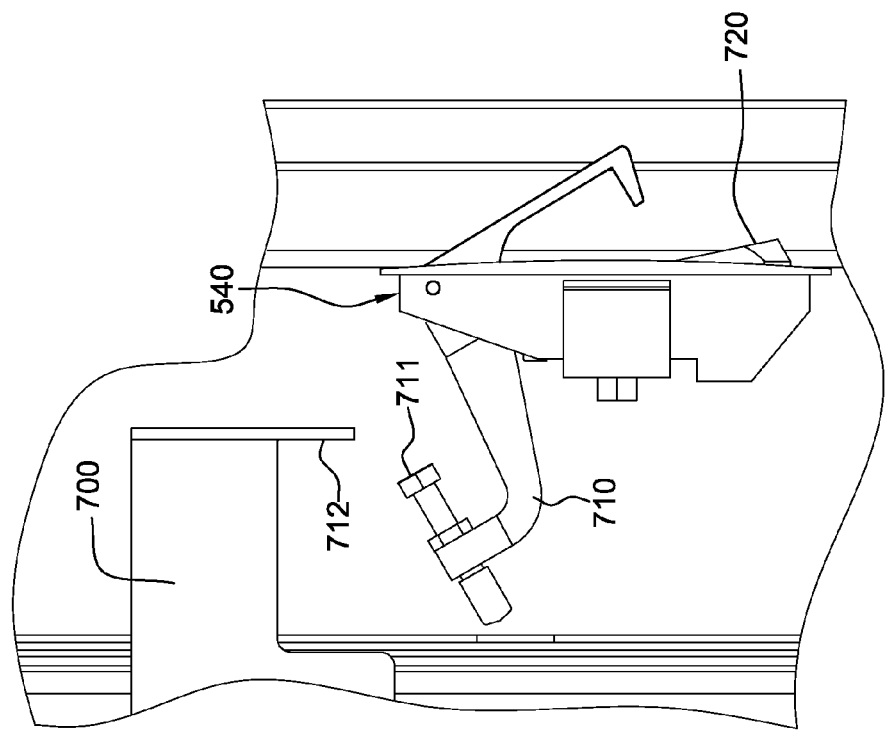
FIG. 7C depicts the partial cross-sectional elevational view of FIG. 7B, with the latch lever unlatched or disengaged from the catch bracket to allow opening of the heat exchanger door, in accordance with one or more aspects of the present invention.
Figure 7B:
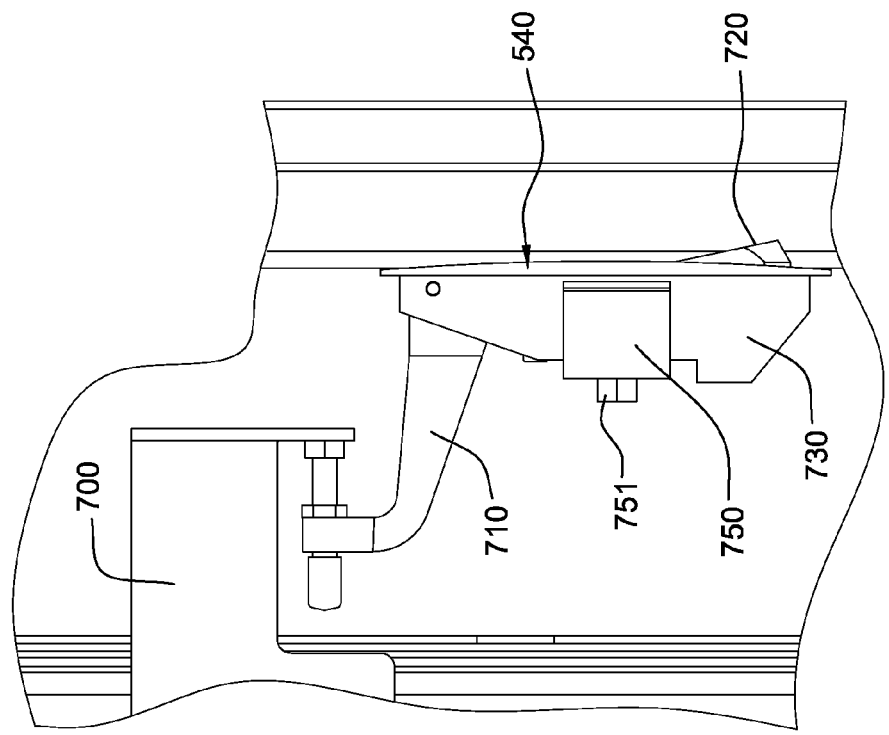
FIG. 7B is a partial cross-sectional elevational side view taken along line 7B-7B in FIG. 7A, and shown with the latch lever of the door latch mechanism latched to the catch bracket of the air-cooling apparatus, in accordance with one or more aspects of the present invention.

As illustrated in FIGS. 7B & 7C, door latch mechanism 540 includes a latch lever or arm 710, which as noted resides entirely within heat exchanger door 510. This pivoting latch lever 710 physically engages catch bracket 700 within the heat exchanger door to hold the heat exchanger door in the latched position illustrated in FIGS. 7A & 7B. FIG. 7C illustrates the heat exchanger door closed, but unlatched, whereby an operator has manually actuated a release 720 to release latch lever 710 from physical engagement with catch bracket 700.

Note that in the embodiment of FIGS. 7A-7C, door latch mechanism 540 comprises a base structure 730 mounted to the door frame at or near outer side 514 of the door, for example, so as to reside within a symmetrical recess 740 (FIG. 7A) at latch edge 512 of the heat exchanger door. Latching of heat exchanger door can be accomplished by closing the heat exchanger door against the electronics rack, and actuating by an operator latch lever 710 to move a latch surface 711 of latch lever 710 into physical engagement with a catch surface 712 of catch bracket 700. As noted, this occurs within the heat exchanger door 510.

Note with reference to FIGS. 7A & 7B, that a U-shaped bracket 750 may be employed in mounting base structure 730 of door latch mechanism 540 to a wall of the door frame. In one embodiment, U-shaped bracket 750 may be secured in bracket-receiving channels via an appropriately-sized bolt 751.

Figure 8A:
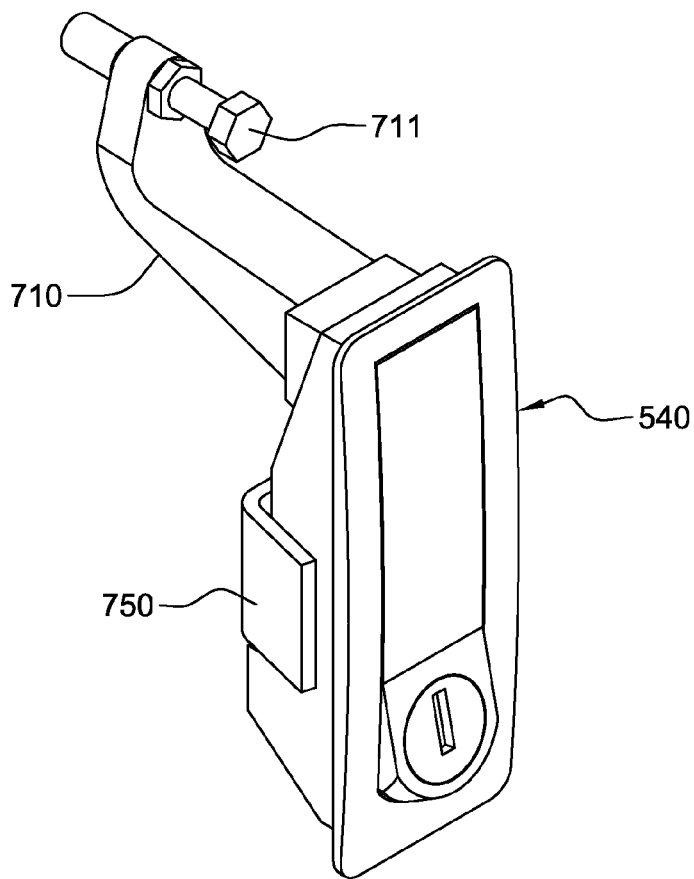
FIG. 8A is a front isometric view of one embodiment of the door latch mechanism of FIGS. 7A-7C, in accordance with one or more aspects of the present invention.
Figure 8B:
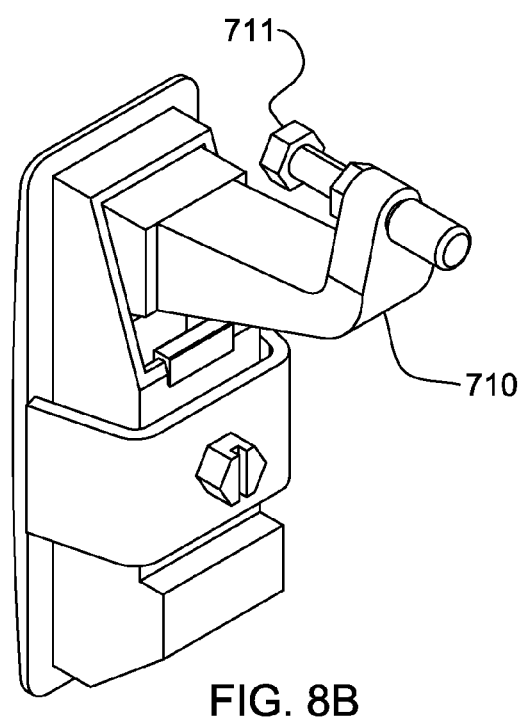
FIG. 8B is a back isometric view of the door latch mechanism of FIG. 8A, in accordance with one or more aspects of the present invention.

FIGS. 8A & 8B depict front and back isometric views of one embodiment of a door latch mechanism, such as described above in connection with FIGS. 7A-7C. In one implementation, door latch mechanism 540 may comprise a lever-type latch, such as offered by Southco, of Concordville, Pa., USA.

Figure 9:
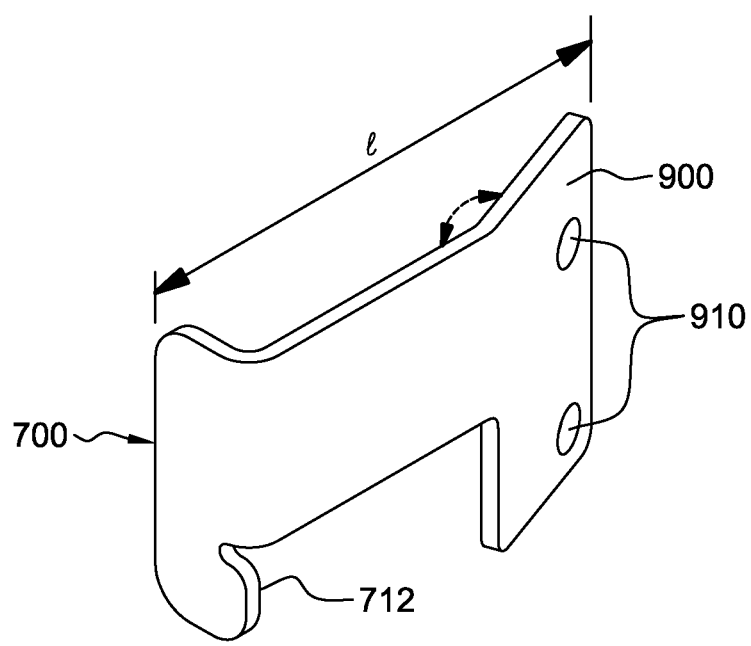
FIG. 9 is an isometric view of one embodiment of the catch bracket of FIGS. 7A-7C of the air-cooling apparatus, in accordance with one or more aspects of the present invention.

FIG. 9 illustrates an isometric view of catch bracket 700 depicted in FIGS. 7A-7C. In one embodiment, catch bracket 700 is fabricated of a one-piece construction, for example, from a rigid material, such as a metal plate. Catch bracket 700 has a length "1" sufficient for catch surface 712 to reside within the heat exchanger door and be positioned for the pivoting latch lever 710, and in particular, latch surface 711 thereof, to engage the catch surface 712 when the latch lever is in the latched position (illustrated, by way of example, in FIGS. 7A & 7B). Catch bracket 700 has a rack-mount portion 900 with, for example, attachment openings 910 which allow for bolting of the rack-mount portion 900, and thus the catch bracket 700, to a corresponding plate (or flange) within the electronics rack, such as illustrated in FIG. 7A. Depending on the orientation of this plate, the angling of the rack-mount portion 900 may change. Note that, in one embodiment, catch surface 712 is oriented substantially parallel to the inner side 513 of heat exchanger door 510, and is thus substantially parallel to the air inlet side and air outlet side of the electronics rack when the heat exchanger door is in latched position.

Advantageously, by providing a catch bracket which extends into the heat exchanger door, and by configuring, sizing and placing the door latch mechanism entirely within the heat exchanger door, the latch mechanism can move towards the latch edge of the heat exchanger door, thereby achieving a goal of expanding the heat exchanger core width. Note that this additional space is achieved by the placement of the door latch mechanism within the door frame and, for example, by configuring the attachment bracket as a U-shaped bracket to closely wrap around the base structure of the door latch mechanism. Also, note that the door latch mechanism disclosed herein is decoupled from the rack flange width. This is significant for both maximizing core width, and adding design flexibility for multiple electronics rack configurations. In the embodiment depicted in FIGS. 7A-7C, the door latch mechanism is not a gate to the heat exchanger core width. In one embodiment, this enables a greater core width, and with an even skinnier latch configuration, would allow for further expansion of the heat exchanger core width. In particular, the door latch mechanism configuration and placement disclosed herein means that the latch itself does not have to cross the plane of the electronics rack, which has certain key advantages, and in particular: the heat exchanger core width can be insensitive to the electronics rack design, by just defining different door catch brackets; and the heat exchanger core width can be maximized, since it is not limited by the electronics rack geometry.

As a further advantage, by providing the catch bracket to extend into the heat exchanger door, and by configuring, sizing and placing the door latch mechanism entirely within the heat exchanger door, the latch mechanism is isolated from any wiring or cabling within the electronics rack that might otherwise be inadvertently engaged by the latch mechanism, and does not constrain cabling space within the electronics rack.

Figure 10:
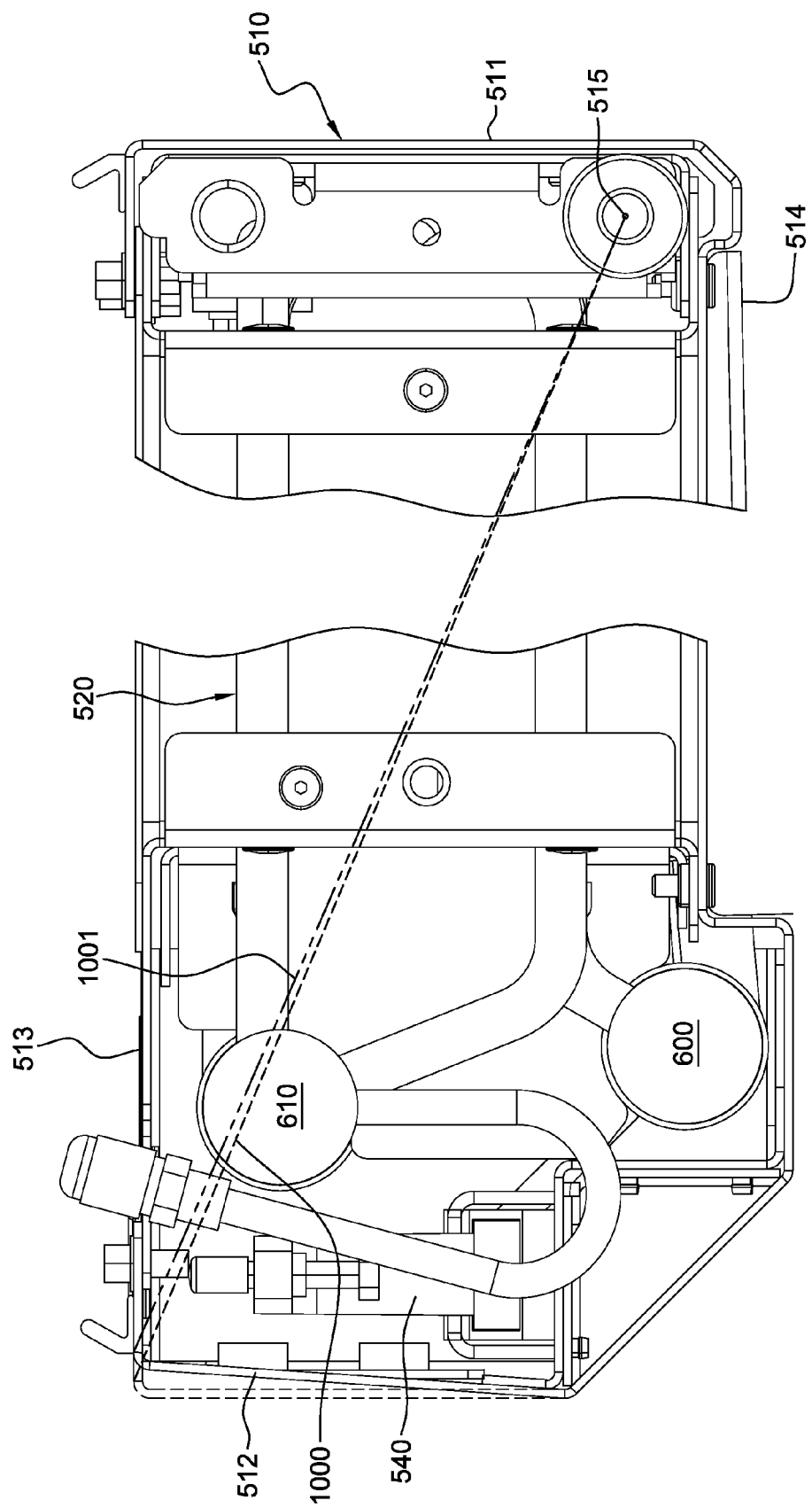
FIG. 10 is a partial cross-sectional plan view of another embodiment of a heat exchanger door, configured with an inward-curved or inward-angled latch edge, in accordance with one or more aspects of the present invention.

Referring to FIG. 10, as noted above, in another aspect, the hinge axis 515 of heat exchanger door 510 is disposed (in one embodiment) at an outer corner of the heat exchanger door, at the door corner between hinge edge 511 and outer side 514. Hinge brackets 530 (FIG. 5A) may be mounted above and below the electronics rack 500 to facilitate this hinge axis location. This allows for the heat exchanger door to be opened adjacent to, for example, another assembly comprising an electronics rack with a similar heat exchanger door or, for example, for the door to be opened adjacent to a wall of the data center. Advantageously, by moving the door latch mechanism 540 to reside entirely within the heat exchanger door as described herein, additional space is freed at the diagonally-opposite corner of the heat exchanger door 510, that is, at the corner defined by latch edge 512 and the inner side 513 of the heat exchanger door. This allows for the latch edge 512 to either curve inward or angle inward from, for example, outer side 514 towards inner side 513, as illustrated (by way of example) in the cross-sectional plan view of FIG. 10. This advantageously results in a pulling in of the diagonal distance along diagonal line 1000 to that of diagonal line 1001, to gain core width from the refrigerator hinge point.

As a further design advantage, the heat exchanger door described herein with reference to FIGS. 5A-10 may be configured so that the door can be installed upside down to, for example, move the hinge edge from one side of the electronics rack to the other side. This ability to flip the heat exchanger door upside down is achieved using the same door latch mechanism in the same vertical location in the heat exchanger rack. If flipped upside down, the air bleed and drain bleed lines would reverse function, with extra care being taken to bleed air from the heat exchanger core in the upside down version. Note that an extra set of hinge plates might be needed in order to flip the heat exchanger door upside down in order to mount the door to a different side of the electronics rack. Mounting the heat exchanger door upside down as described herein would advantageously place the quick connects for the coolant inlet and outlet manifolds at the top of the heat exchanger door, and thus facilitate coupling of the heat exchanger door to overhead coolant supply and return manifolds, depending upon the configuration of the data center.

As another enhancement, disclosed herein is an enhanced structural configuration of a heat exchanger door comprising a door assembly sized and configured to span at least a portion of the air inlet side or the air outlet side of the electronics rack. The door assembly includes an airflow opening which facilitates the ingress or egress of airflow through the electronics rack with the heat exchanger door coupled thereto. Further, the door assembly includes an air-to-coolant heat exchanger and a structural support. The air-to-coolant heat exchanger is disposed so that airflow through the airflow opening passes across the air-to-coolant heat exchanger, and is configured to extract heat from the airflow passing thereacross. The heat exchanger includes a heat exchanger core and a heat exchanger casing coupled to the heat exchanger core. The heat exchanger core includes at least one coolant-carrying channel which loops through the heat exchanger casing at one side or edge of the heat exchanger core. The structural support is attached to the heat exchanger casing, and together the structural support and the heat exchanger casing define a tubular door support beam or structure, wherein the at least one coolant-carrying channel loops through the heat exchanger casing within the tubular door support beam.

Advantageously, the above-described integrating or forming of the tubular door support beam or structure about the heat exchanger casing compacts the door frame, and thus allows a further increase in the heat exchanger core width for a given overall heat exchanger door size. In one embodiment, the heat exchanger casing defines, at least partially, one or more sides of the tubular door support beam, and results in a stiff, strong, lightweight support structure, which, in one embodiment, is provided in an almost direct path with a hinge axis of the heat exchanger door. In such an embodiment, the hinge loading is advantageously transitioned into the heat exchanger with which the tubular door support beam is integrated, and not through a separate door frame surrounding the heat exchanger.

Figure 11A:
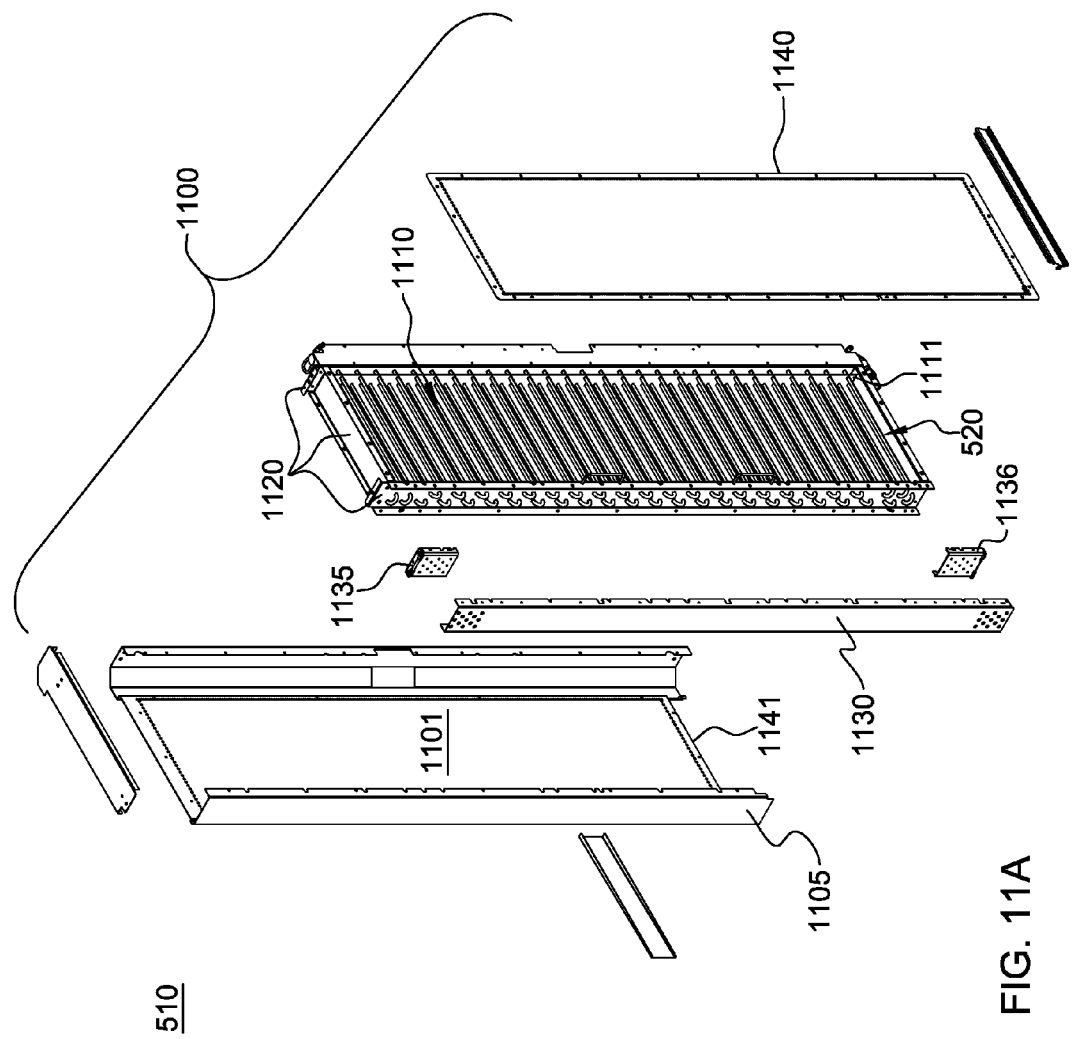
FIG. 11A is a partially exploded view of one embodiment of a heat exchanger door assembly, in accordance with one or more aspects of the present invention.
Figure 11B:
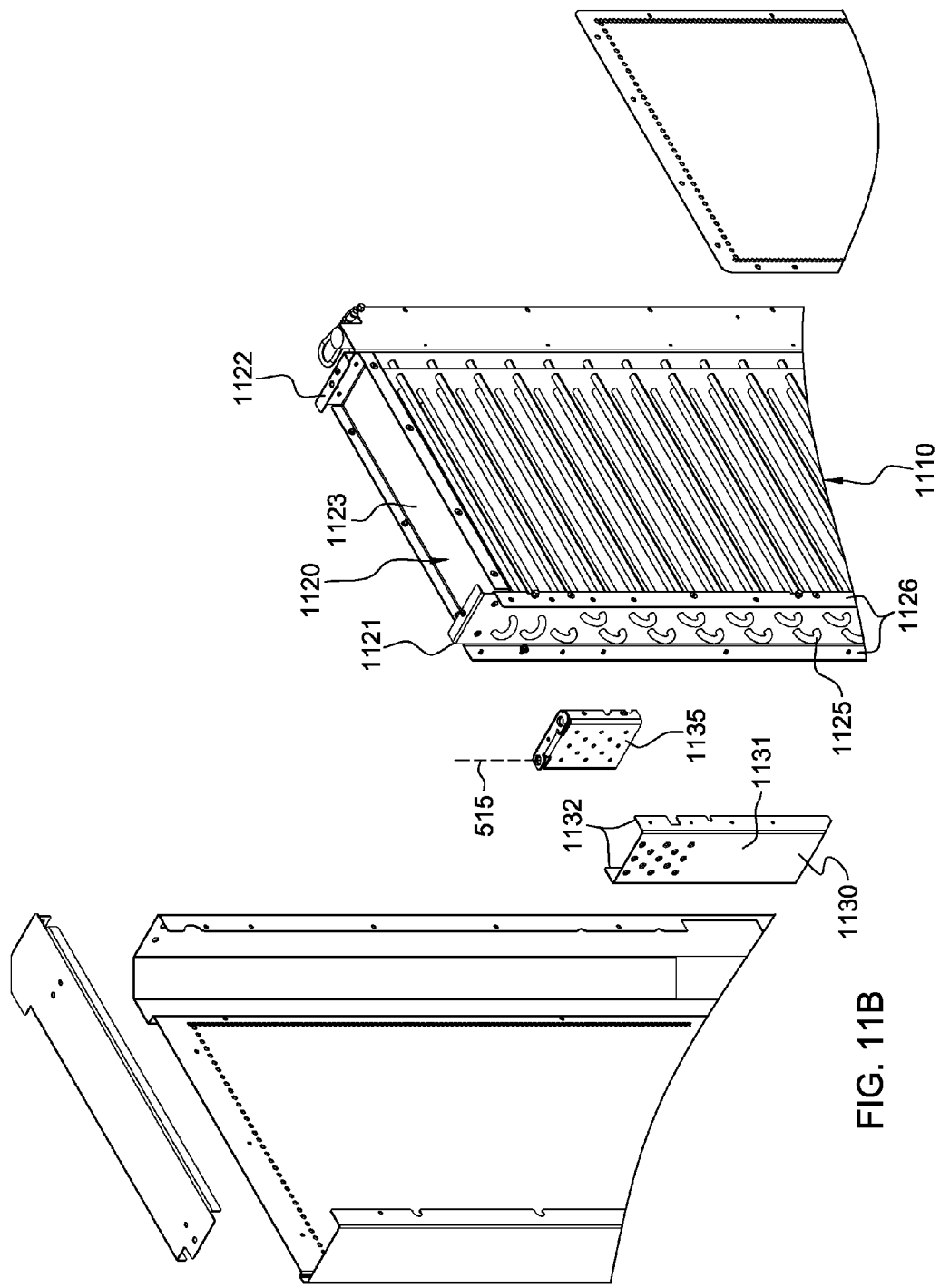
FIG. 11B is an enlarged depiction of an upper portion of the partially exploded door assembly of FIG. 11A, in accordance with one or more aspects of the present invention.
Figure 11C:
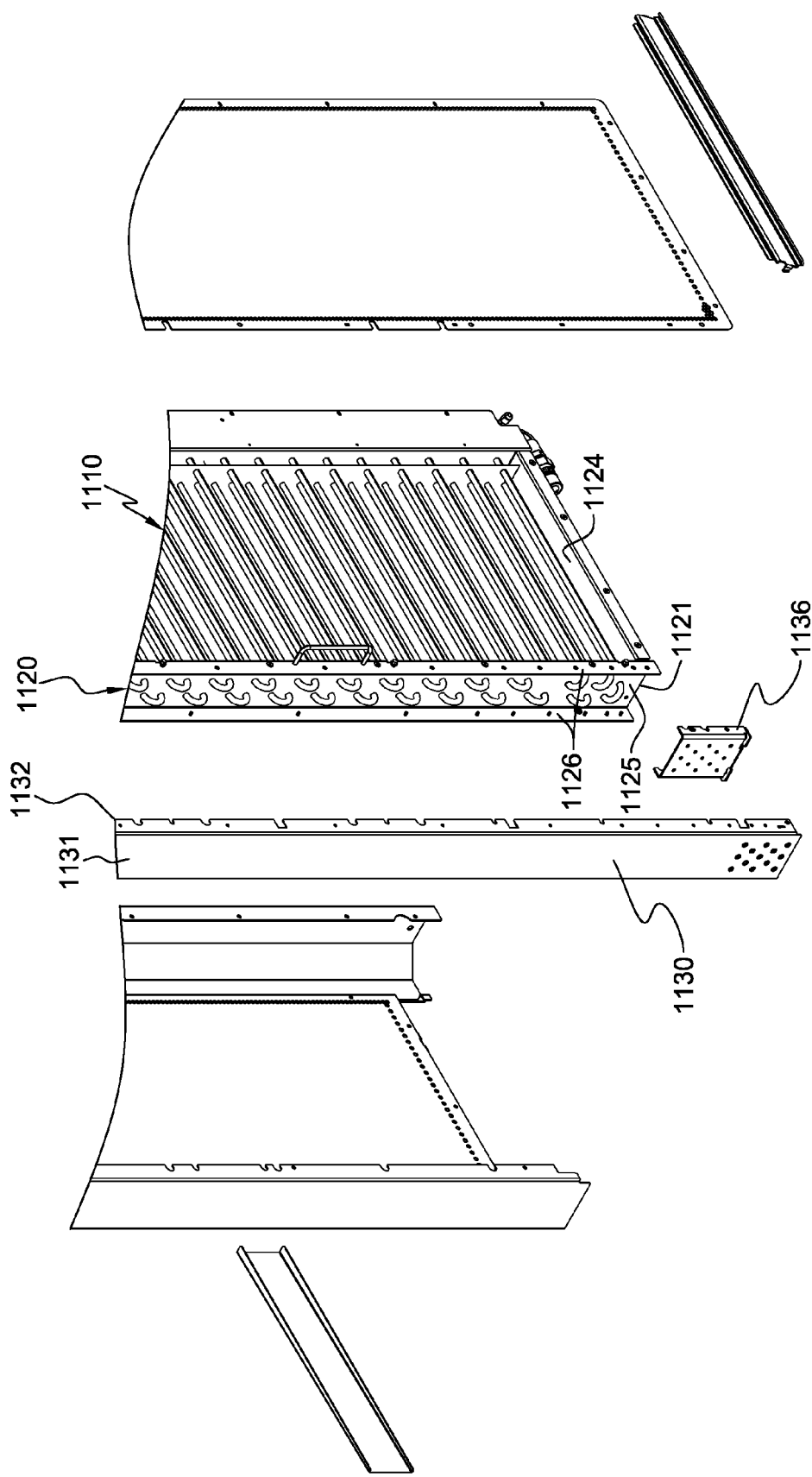
FIG. 11C is an enlarged depiction of a lower portion of the partially exploded door assembly of FIG. 11A, in accordance with one or more aspects of the present invention.

Referring collectively to FIGS. 11A-11C, one embodiment of a heat exchanger door 510 is depicted which comprises a door assembly 1100. Door assembly 1100 includes an outer door shell (or wrap) 1105 with an airflow opening 1101 configured to facilitate the ingress or egress of airflow through an electronics rack with the heat exchanger door coupled thereto. In one embodiment, door shell 1105 may comprise a single-piece, outer wrap or shell, which provides additional structure to the heat exchanger door, without consuming any significant core width, and adds minimal weight to the heat exchanger door.

As illustrated, the door assembly includes air-to-coolant heat exchanger 520, such as described above in connection with FIGS. 5A-10. In one embodiment, air-to-coolant heat exchanger 520 includes one or more coolant-carrying channels defined by one or more tubes in one or more tube sections. In one implementation, the one or more tubes transverse one or more times across the width of the heat exchanger core and back, after making a 180° turn or loop. Also as noted above, each heat exchange tube section may be a continuous tube having a first diameter, and that couples to the coolant inlet and outlet manifolds 600, 610, each of which may be a tube having a second diameter, wherein the second diameter is greater than the first diameter. As noted above, the first and second diameters are chosen to ensure adequate supply of coolant flow through the multiple heat exchange tube sections. The tube sections have a plurality of thermally conductive fins 1111 coupled thereto (only one of which is illustrated), which together define a heat exchanger core 1110 of the air-to-coolant heat exchanger 520. As illustrated in FIGS. 11A-11C, heat exchanger core 1110 is surrounded, in one example, by a heat exchanger casing 1120. In one embodiment, heat exchanger casing 1120 provides structural support for heat exchanger core 1110.

In accordance with an aspect of the present invention, a structural support (or channel plate) 1130 is attached to heat exchanger casing 1120, for example, along a vertically-extending edge of the heat exchanger core. Optionally, an upper hinge support bracket 1135 and a lower hinge support bracket 1136 may also be employed to provide additional structural rigidity to the tubular door support beam defined by structural support 1130 attached to heat exchanger casing 1120. Multiple fasteners, such as bolts, screws, rivets, etc., may be employed in securely, rigidly attaching structural support 1130, upper and lower hinge support brackets 1135, 1136, and heat exchanger casing 1120 together, and thus define the tubular door support beam such as disclosed herein. In the embodiment illustrated, the heat exchanger door also comprises a perforated inner screen 1140 and a perforated outer screen 1141, which can be employed (for example) to prevent an operator from physically contacting any sharp edges within the door assembly 1100, and to protect the heat exchanger fins from damage.

FIGS. 11B & 11C depict enlarged views of the upper and lower portions of the partially exploded door assembly 1100 of FIG. 11A. In the embodiment illustrated, heat exchanger casing 1120 wraps around heat exchanger core 1110, and includes opposite, vertically-extending casing portions 1121, 1122, and opposite, horizontally-extending casing portions 1123, 1124. The tubular support beam disclosed herein is formed, in one embodiment, around vertically-extending casing portion 1121, disposed opposite to vertically-extending heat exchanger casing 1122, adjacent to which (in one embodiment) the coolant inlet and outlet manifolds 600, 610 are disposed (see FIGS. 6 & 10). Heat exchanger casing portion 1121 comprises, by way of example, a first plate 1125 with flanges 1126 extending therefrom. Similarly, structural support 1130 comprises, in one embodiment, a second plate 1131 with flanges 1132 extending therefrom. As shown, second plate 1131 with flanges 1132 is sized and configured to physically contact first plate 1125 with flanges 1126. When assembled and attached as depicted, a tubular door support beam or structure is defined, which in one embodiment, is an elongate, tubular beam integrated with the heat exchanger and oriented substantially vertically within the door assembly. This resultant tubular door support beam is, in one embodiment, rectangular-shaped in transverse cross-section.

By way of specific example, heat exchanger casing 1120 and support structure 1130 may each be fabricated of aluminum, in which case, upper hinge support bracket 1135 and lower hinge support bracket 1136, may be fabricated of a more structurally rigid material, such as steel. Note that in an alternate embodiment, support structure 1130 may be fabricated, for example, of steel, in which case, upper and lower hinge support brackets 1135, 1136 could be omitted from the door assembly, that is, with a configuring of the top and bottom edges of the support structure 1130 to accommodate, for example, the above-discussed hinge pins disposed at the hinge axis. Note also that a plurality of fasteners may be advantageously employed to distribute the load from the hinge axis due, for example, to opening or closing of the heat exchanger door. In addition, note that in this embodiment, the hinge axis substantially aligns with or is within the tubular door support beam defined by support structure 1130 and heat exchanger casing 1120, or more particularly, vertically-extending casing portion 1121 of heat exchanger casing 1120.

As illustrated herein, the tubular door support beam is advantageously formed around multiple coolant-carrying channel or tube bends, which comprise loops through heat exchanger casing 1120 at vertically-extending casing portion 1121. Advantageously, by disposing these coolant-carrying channel or tube bends within the tubular door support structure defined by structural support 1130 and heat exchanger casing 1120, further compacting of the door structure is achieved. This integrated structure is depicted in further detail in FIGS. 12A-13.

Figure 12A:
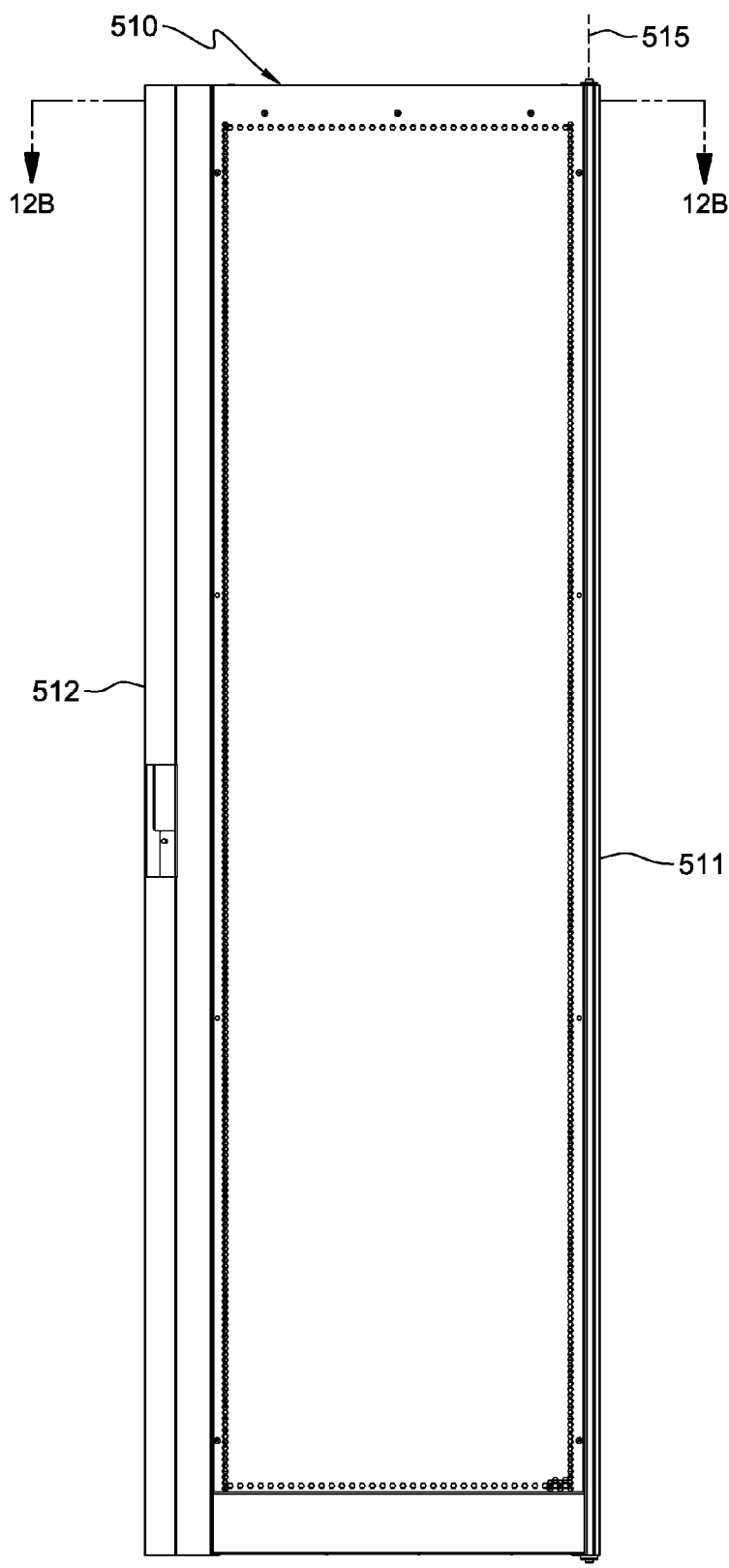
FIG. 12A is a front elevational view of the assembly of FIGS. 5A & 5B, with the heat exchanger door coupled to the electronics rack, in accordance with one or more aspects of the present invention.
Figure 12B:
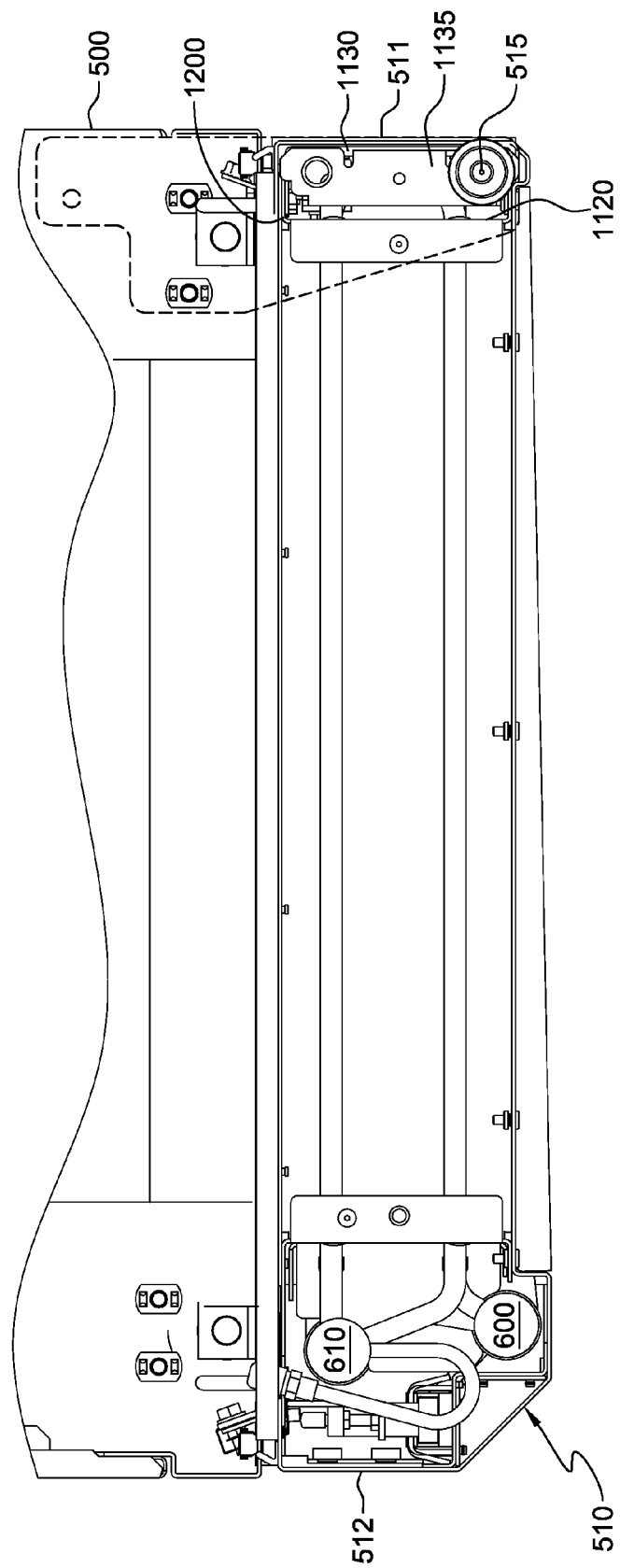
FIG. 12B is a partial cross-sectional plan view of the assembly of FIG. 12A, taken along line 12B-12B thereof, in accordance with one or more aspects of the present invention.

Referring to FIGS. 12A & 12B, heat exchanger door 510 is depicted hingedly mounted along hinge axis 515 to electronics rack 500. As illustrated, and as described above, hinge axis 515 is disposed at or adjacent to a hinge edge 511, which in one embodiment, comprises a vertically-extending edge or region of heat exchanger door 510 disposed opposite to vertically-extending latch edge 512. As illustrated in FIG. 12B, coolant inlet manifold 600 and coolant outlet manifold 610 are disposed at one side of the air-to-coolant heat exchanger 520, and the tubular door support beam 1200 is disposed at the opposite side of the air-to-coolant heat exchanger 520. As described above, tubular door support beam 1200 is integrated with the air-to-coolant heat exchanger by configuring and attaching structural support 1130 to, for example, a vertically-extending casing portion of heat exchanger casing 1120. Note that, as illustrated in FIG. 12B, hinge axis 515 of the heat exchanger door 510 advantageously resides within or is aligned over the tubular door support beam 1200 so that any load resulting from hinged opening or closing of the heat exchanger door is distributed by the tubular door support beam to the air-to-coolant heat exchanger 520, with which the beam is integrated.

Figure 13:
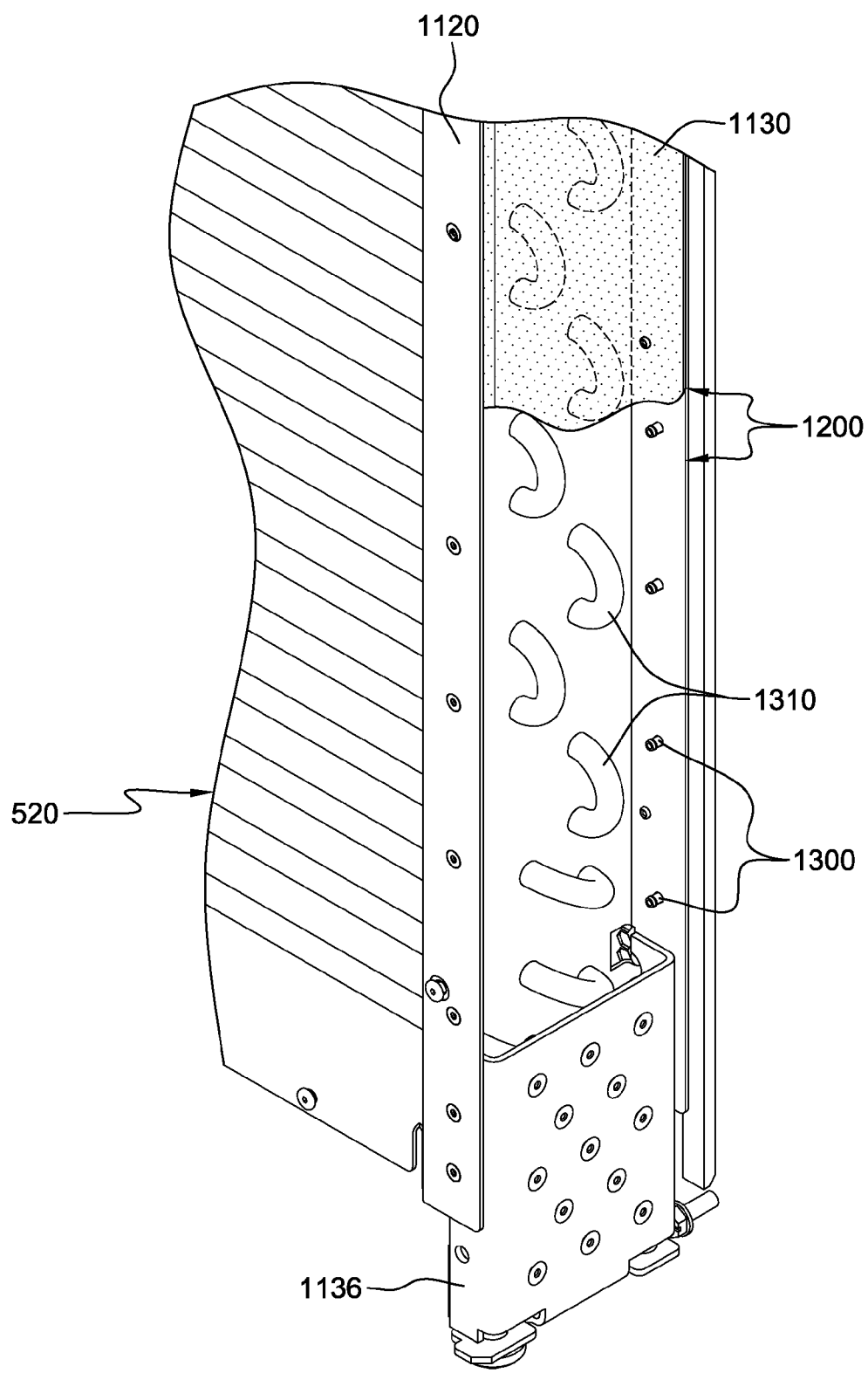
FIG. 13 is an isometric view of a portion of one embodiment of a heat exchanger door assembly, illustrating a structural support coupled to the heat exchanger casing, and defining a tubular door support beam structure, in accordance with one or more aspects of the present invention.

FIG. 13 depicts the integration of tubular door support beam 1200 with air-to-coolant heat exchanger 520 in greater detail. As illustrated, multiple fasteners, such as rivets 1300, may be employed to couple support structure 1130 to the heat exchanger casing 1120 at, for example, the vertically-extending casing portion along the side of the air-to-coolant heat exchanger. Multiple coolant-carrying channels (or tubes) of the heat exchanger core are shown to loop 1310 through heat exchanger casing 1120 and reside within the tubular door support beam or structure 1200 defined by the structural support 1130 and heat exchanger casing 1120. Also, illustrated in FIG. 13 is lower hinge support bracket 1136, which may be employed, in one embodiment, where the support structure 1130 is fabricated of a lighter weight material, such as aluminum.

Advantageously, integration of a tubular door support beam with the air-to-coolant heat exchanger, and in particular, with the heat exchanger casing, allows for a reduction in the non-usable width of the heat exchanger door for the core, and thus allows for the heat exchanger core to be expanded. In essence, the heat exchanger itself becomes at least partially the structure of the door, with any hinge loading going directly to the heat exchanger, and not through, for example, a structural door frame encircling the heat exchanger. An outer shell (or wrap) may be provided to add some additional structural support, without consuming any significant core width, and adding minimal weight. The above-described integration of the tubular door support beam with the heat exchanger advantageously allows for the heat exchanger door to be shipped mounted to the electronics rack, which requires a robust construction. This is achieved, as explained above, without consuming the critical width of the heat exchanger core.

By integrating the tubular beam with the heat exchanger core such that the loops or bends of the tubes at least partially reside within the tubular beam, a more compact structure is obtained. The entire construction may be secured together via, for example, riveting, resulting in a strong and stiff construction, low cost, lightweight heat exchanger door and tubular beam. Upper and lower hinge support brackets may optionally be provided to distribute any load, for example, from shock or vibration, to the tubular beam. The resultant structure is very space efficient, and allows a maximization of heat exchanger core width. In one embodiment, by integrating the tubular beam with the heat exchanger core as described herein, approximately 10-25 mm of additional heat exchanger core width can be obtained.

In accordance with further aspects of the present invention, and as described above, the air-to-coolant heat exchanger disclosed herein includes one or more coolant-carrying channels, such as channels defined by one or more tubes arranged in one or more tube sections. In one embodiment, each heat exchange tube section may comprise a continuous tube having a first diameter which couples to the coolant inlet and outlet manifolds. The inlet and outlet manifolds may each be a tube having a second diameter, wherein the second diameter is greater than the first diameter. The first and second diameters are chosen to ensure adequate supply of coolant flow through the multiple heat exchange tube sections. In another embodiment, the cross-sectional area in the direction of the coolant flow path may vary and be tailored to ensure that coolant uniformly flows through the plurality of coolant channels (also referred to herein as a plurality of coolant circuits).

The coolant inlet and outlet manifolds may be manufactured from any desired material or combination of materials. Factors such as material properties, cost, manufacturing considerations, and other characteristics may be taken into consideration when determining the material or materials of the coolant inlet and outlet manifolds. In one embodiment, the coolant inlet and outlet manifolds may be copper tubes.

As discussed above, the coolant channels may have one or more fins coupled thereto, which together define the heat exchanger core of the air-to-coolant heat exchanger. These fins act to increase heat transfer to the coolant in the channels by increasing the surface area of the heat exchanger core in contact with the airflow thereacross, and are coupled to, or otherwise in contact with, the one or more coolant channels so that heat is transferred from the airflow to the coolant. The fins may take various forms or shapes, such as a helical fin or a plate fin. For example, the fins may be any plate fin, such as a flat plate fin, a sine wave fin, a corrugated fin, a louvered fin, etc., or combinations thereof. Depending on the implementation, the finstock thickness between heat exchangers may vary. For example, the finstock thickness may be within a range of about 0.0035 to 0.0095 inches thick.

Similar to the manifolds, the fins may be manufactured from various materials or combination of materials by various methods. Factors such as material properties, cost, manufacturing concerns and other characteristics may be taken into consideration when determining the fin material or materials.

In one embodiment, the heat exchanger core may include a plurality of fins spaced substantially across the width of the heat exchanger core. In such an embodiment, the plurality of fins may be spaced from one another with a regular fin pitch or density, and configured so that air readily passes between adjacent fins. By way of example, the fin pitch may be between about 5 fins per inch to about 20 fins per inch.

The size, shape, orientation, pitch (e.g., fins/inch), material properties, surface finish and/or texture and other aspects of fin construction may contribute to heat removal capability and to air pressure drop across the air-to-coolant heat exchanger. These fin attributes may be selected in combination with other aspects of the heat exchanger core, such that the air pressure drop and heat removal of the air-to-coolant heat exchanger are both optimized, that is, for one or more boundary conditions. Note that as used herein, "optimized" heat exchanger metrics refers to a best or desirable combination of metrics for a particular application, and may include, for example, a maximum heat removal capability with a minimum air pressure drop across the heat exchanger. The fins may also contribute to other characteristics or metrics of the air-to-coolant heat exchanger, and/or the heat exchanger core, such as weight, cost, depth and height of the heat exchanger. As such, aspects of the fins may also be optimized in consideration of such other characteristics or metrics. For example, the fins may be optimized for one or more boundary conditions, for air pressure drop, heat removal, weight, depth, cost and/or combinations thereof.

As described above, the heat exchanger core of the air-to-coolant heat exchanger includes a plurality of channels or tubes for the flow of coolant therethrough. By way of example, channel inlets may be coupled in fluid communication with the coolant inlet manifold, and channel outlets may be coupled in fluid communication with the outlet manifold. This allows coolant to flow through the inlet manifold, into the plurality of coolant channels via their corresponding channel inlets, through the plurality of coolant channels, and from the coolant channels and into the coolant outlet manifold via their corresponding channel outlets. In certain embodiments, the inlet and outlet of a coolant channel may be considered to be the openings in the inlet and outlet manifolds, which allow coolant to flow to or from the coolant channels.

The coolant channels themselves may be defined by a variety of structures. For example, a coolant channel may be formed from a continuous structure, or from multiple structures connected together. Further, the structure defining the coolant channel may be made from a variety of materials or combination of materials. Factors such as material properties, cost, manufacturing concerns and other characteristics may be taken into consideration when determining a material for the coolant channels. In one embodiment, the plurality of coolant channels include or are defined by copper tubing.

As another consideration, the cross-sectional area of a coolant channel in the direction of the coolant flow path may be constant or may vary. Further, the shape of a coolant channel (interior and/or exterior) may be constant or may vary, and may be any desired cross-sectional shape. In some embodiments, each coolant channel of the plurality of coolant channels has a substantially similar shape and size, and each coolant channel is defined by substantially similar, but distinct, structures. In other embodiments, two or more coolant channels of the plurality of coolant channels may have a substantially dissimilar shape and/or size. In some embodiments, two or more of the coolant channels may be identically formed. In certain embodiments discussed herein, the plurality of coolant channels are defined by one or more tube structures, and the cross-sectional area of the coolant channels in the direction of coolant flow path is substantially constant. In one embodiment, the tubes defining the coolant channels may be fabricated of commercially available tubing.

Figure 14:
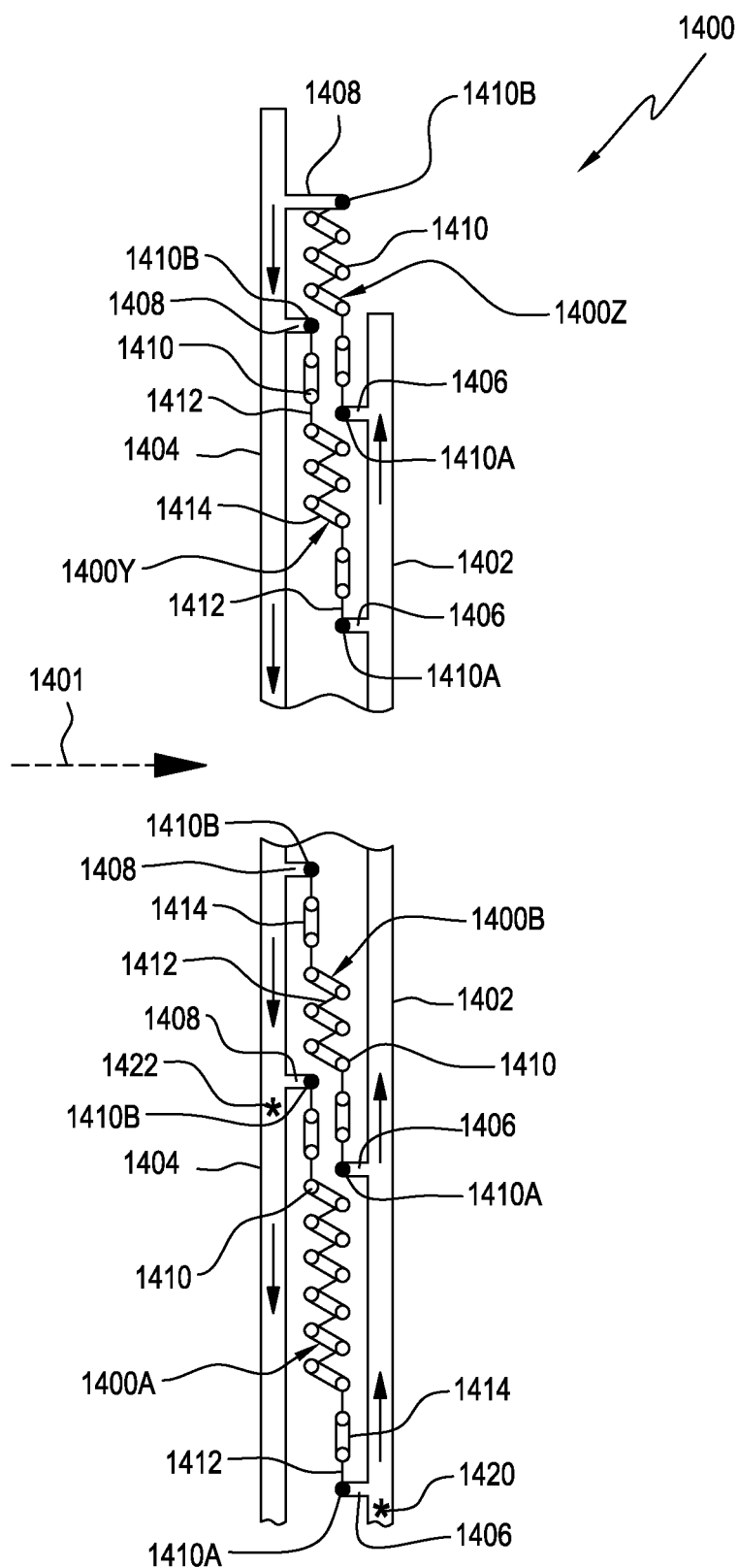
FIG. 14 is a side elevational view of one embodiment of a portion of a plurality coolant channels and inlet and outlet manifolds of a heat exchanger configuration, in accordance with one or more aspects of the present invention.
Figure 15:
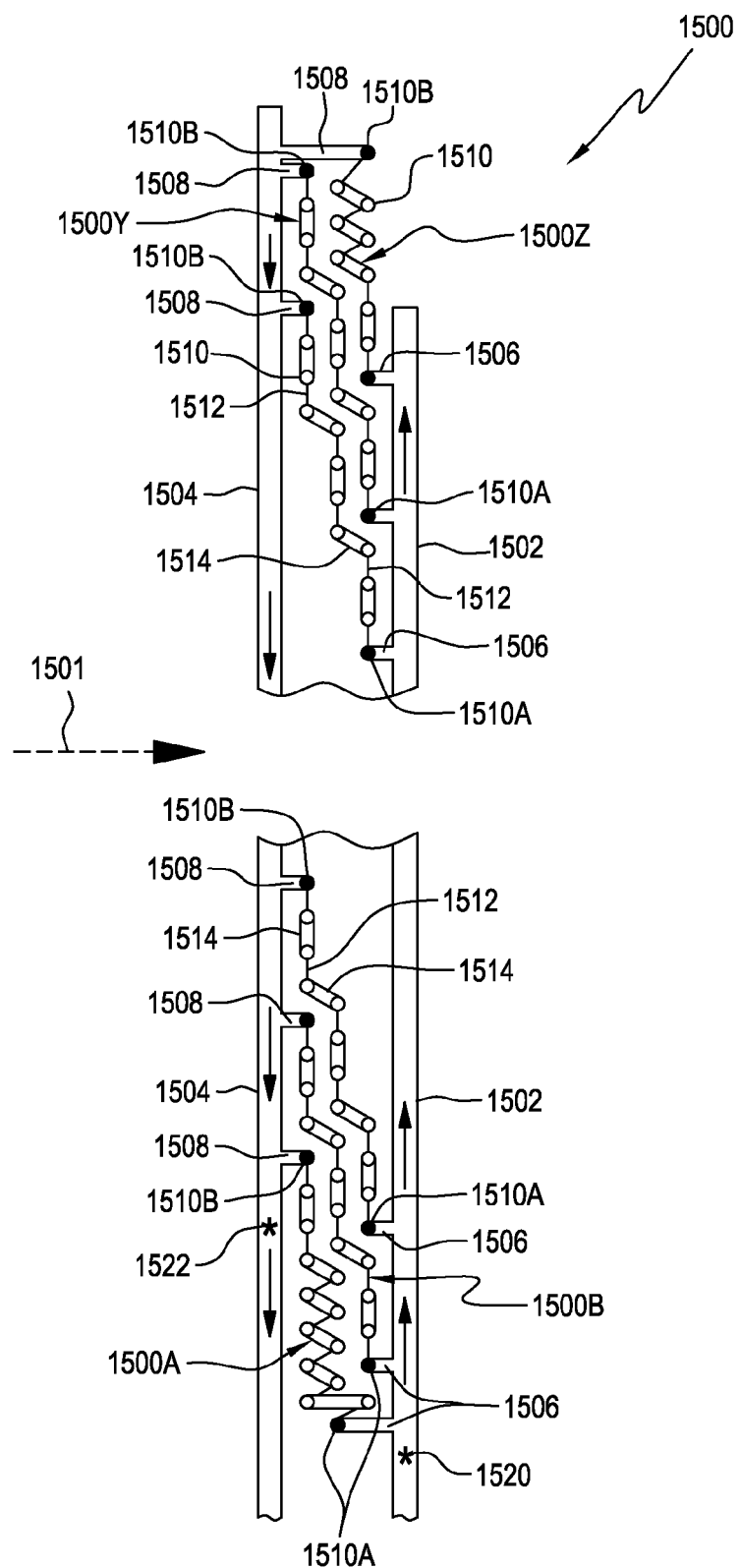
FIG. 15 is a side elevational view of another embodiment of a portion of a plurality coolant channels and inlet and outlet manifolds of a heat exchanger configuration, in accordance with one or more aspects of the present invention.
Figure 16:
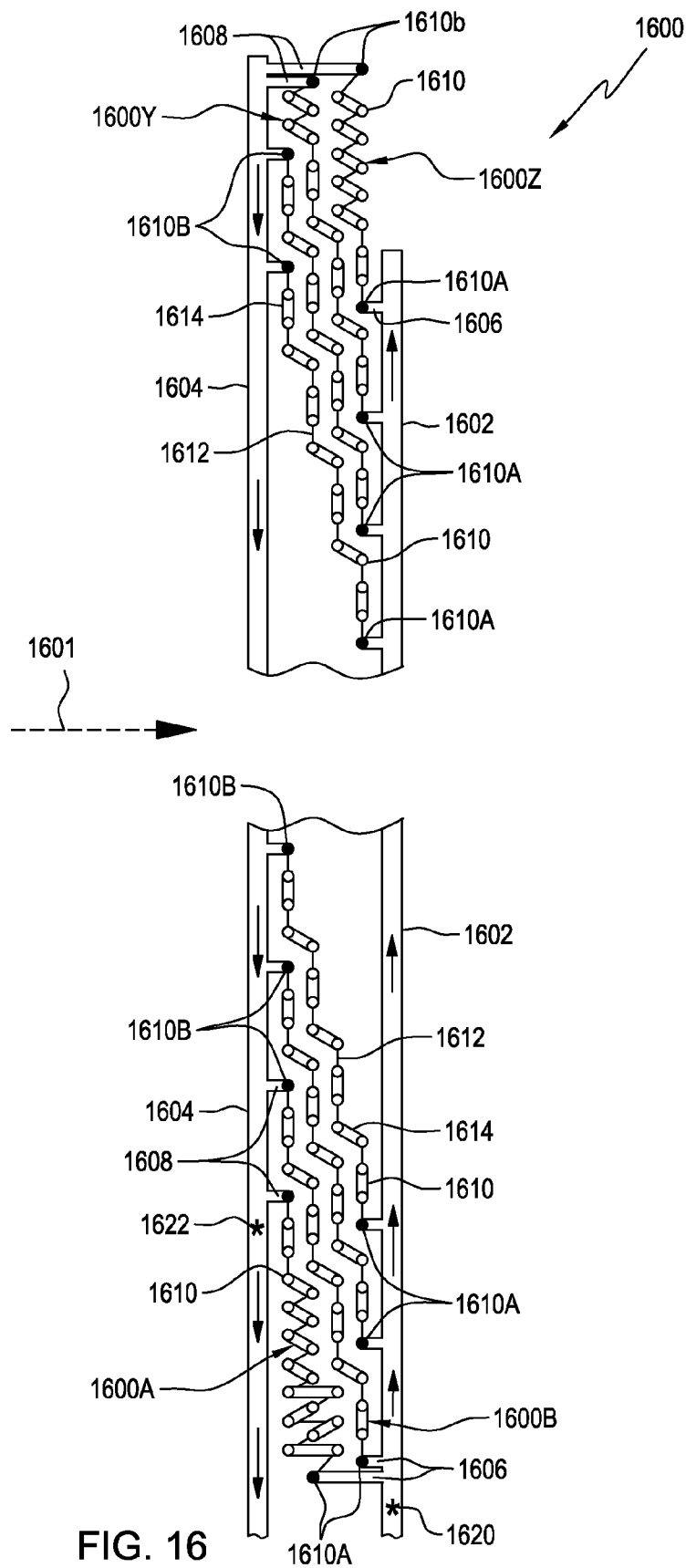
FIG. 16 is a side elevational view of a further embodiment of a portion of a plurality coolant channels and inlet and outlet manifolds of a heat exchanger configuration, in accordance with one or more aspects of the present invention.

As described above, the plurality of coolant channels may extend substantially across the airflow to be cooled, such as back-and-forth across the airflow opening of the heat exchanger door. The total number of tubes (or other shaped structures) of a particular heat exchanger core, may depend upon the size and/or shape of the tubes (i.e., the structure defining the coolant channels), the available heat exchanger core depth and height, the number of rows of the tubes in the direction of the airflow, the tube spacing in the vertical and horizontal directions, the arrangement of the tubes, the positioning and/or orientation of the tubes, and the like. In certain heat exchanger core embodiments, the portions of the plurality of coolant channels extending across the airflow (and/or an airflow opening) are substantially arranged in horizontal rows in the direction of airflow. For example, the portions of the channels extending across the airflow may be substantially arranged in two, three, or four (or more) rows, such as illustrated in FIGS. 14-16 and discussed below. In certain embodiments, the vertical spacing between the portions of the channels extending across the airflow may be greater than the spacing in the direction of the airflow (i.e., the spacing between rows).

In embodiments wherein the plurality of coolant channels are defined by substantially identical tubes, and the tubes extend substantially horizontally across the airflow (or airflow opening), the diameter of the tubes, the spacing in the vertical and horizontal (or airflow) directions, the heat exchanger core height and the number of rows of the tubes in the direction of the airflow together effect the total number of tubes in a particular heat exchanger core design. Note that in other embodiments, the structure defining the plurality of coolant channels need not extend substantially horizontally across the airflow opening. Similarly, in certain embodiments, the portions of the channels extending substantially across the airflow need not be aligned and, thus, need not extend parallel to each other.

As discussed above with respect to the fins, the parameters, aspects or characteristics of the coolant channels may affect the performance metrics of the heat exchanger. For example, the size and shape of the structure (or structures) defining the coolant channels, the number of rows of cooling channels, the channel or tube spacing in the vertical and the airflow directions, the total number of coolant channels extending across the airflow, the number of coolant channels or circuits (e.g., the number of discrete pathways of coolant from the inlet manifold to the outlet manifold) may affect the heat removal of the heat exchanger, the air side pressure drop, the water side pressure drop, the core weight, the core depth and/or the cost of the heat exchanger. As a result, in certain embodiments, at least one variable parameter of the coolant channels, such as one of the parameters listed above, may be chosen to optimize one or more performance metrics of the heat exchanger core in which the plurality of coolant channels are installed for particular boundary conditions. For example, in a heat exchanger embodiment where tubes define the plurality of coolant channels, a combination of two or more of tube diameter, the number of rows of the tubes in the airflow direction, tube spacing in the vertical and/or horizontal directions, core height, number of coolant channels or coolant circuits and non-variable parameters of the heat exchanger may affect optimization of the air pressure drop, heat removal, weight, depth and cost of the heat exchanger for particular boundary conditions.

As noted, the number of coolant channels may vary (i.e., may be a variable parameter of the heat exchanger), and may affect one or more performance metrics of the heat exchanger in which the coolant channels are installed. For example, the number of coolant channels (i.e., the number of discrete flow paths for the coolant) may affect the heat removal, water side pressure drop, core weight, coolant flow distribution, cost, etc.

FIGS. 14-16 illustrate several coolant channel configurations for consideration of certain of the parameters described above. By way of example, FIG. 14 is a side illustration of a portion of a plurality of cooling channels (or circuits) 1400 with an airflow 1401 passing across the plurality of cooling channels 1400 traveling (by way of example only) substantially left-to-right (as indicated by the arrow). As shown, the plurality of cooling channels 1400 are defined by tubes that extend (in one embodiment) substantially linearly horizontally, and therefore parallel to one another, across airflow 1401. The linear tubes or portions that extend across airflow 1401 are arranged (in this example) in two rows in the direction of the airflow 1401, and are illustrated in FIG. 14 as circles 1410 (i.e., as tubes extending along a direction extending into, or out of, the page). Note that as used herein, "row" is used to refer, for example, to a two-row heat exchanger, three-row heat exchanger, four-row heat exchanger, etc., when viewed in top plan view. In side elevational view, a "row" as used herein appears as a column of coolant-carrying channels or tubes (such as depicted in FIGS. 14-16). Note also, the heat exchanger examples presented herein are configured in a counter-flow arrangement with, for example, airflow 1401 moving left-to-right across the heat exchanger and coolant moving through the cooling channels (or circuits), generally from right-to-left within the heat exchanger between a channel inlet and a channel outlet. that is, for many of the cooling channels within the heat exchanger. This counter-flow arrangement is also illustrated in FIGS. 14-16, and discussed further below.

Each of the plurality of cooling channels 1400 of FIG. 14 extends from an inlet manifold 1402 that supplies coolant to the cooling channels 1400, to an outlet manifold 1404 that provides an outlet for the coolant after flowing through the cooling channels 1400. The flow path of the coolant is indicated in the inlet and outlet manifolds 1402, 1404 by arrows. Each of the cooling channels 1400 includes a channel inlet 1406 and a channel outlet 1408. In the illustrated embodiment, the inlets 1406 may extend from the inlet manifold 1402 to a first tube portion 1410A (solid circle) that extends across the airflow 1401. The first tube portion 1410A is a first tube portion of each of the cooling channels 1400 in the direction of the coolant flow path. Similarly, the outlets 1408 may extend from the outlet manifold 1404 to the last tube portion 1410B (solid circle) that extends across the airflow 1401. This last tube portion 1410B is the last channel portion of each of the cooling channels 1400 in the direction of coolant flow.

After first tube portion 1410A of each of cooling channel 1400 extends across the airflow 1401, the cooling channel loops, bends or otherwise changes direction such that the channel extends back across the airflow 1401 for a second pass (outlined circle) across the airflow 1401, as shown. The loop or bend 1412 that acts to redirect the channel back across the airflow 1401 on the opposing side of the heat exchanger, is represented or indicated by a single straight line in FIG. 14. Once back on the "inlet side" of the airflow 1401, the channel (and therefore coolant carried therein) is again redirected such that it extends back for a third pass (outlined circle) across the airflow 1401. The loop 1414 that acts to redirect the channel or tube back across the airflow 1401 from the "inlet side" of the airflow 1401 is indicated by a double line in FIG. 14. In such a manner, the cooling channels 1400, and the coolant carried therein, zigzag, crisscross, or otherwise travel back and forth across the airflow 1401 (or an airflow opening). Adjacent portions of the cooling channels 1400 in the direction of the coolant flow that extend across the airflow 1401 are thus configured in an alternating flow arrangement.

As discussed above, in one embodiment, the coolant channels extend back and forth across the airflow 1401 until last tube portion 1410B (solid circle) that is coupled to the outlet 1408 and the outlet manifold 1404. Thereby, the flow path of the coolant through the coolant channels 1400 and the inlet and outlet manifolds 1402, 1404, can be said to extend from a first fixed point 1420 in the inlet manifold 1402, through the inlets 1406 and into the coolant channels 1400, through the portions of the cooling channels 1400 extending across the airflow 1401 and the loops 1412, 1414 therebetween, through the outlets 1408 and into the outlet manifold 1404, and finally through the outlet manifold 1404 to a second fixed point 1422 in the outlet manifold 1402.

In the embodiment depicted in FIG. 14, the coolant channels 1400 include discrete channels that differ from one another. For example, some of the channels include differing positioning and patterns of tube portions 1410 that extend across the airflow 1401. Stated differently, the pattern of the vertical and horizontal spacing between adjacent portions 1410 of the channels in the direction of the coolant flow path may differ between coolant channels. Still further, the total length of the coolant channels 1400 may differ from one another.

By way of specific example, the first coolant channel 1400A of the plurality of coolant channels 1400 fed by the inlet manifold 1402 may include four consecutive channel portions 1410 in a first row (including the first portion 1410A (solid circle)), followed by ten channel portions 1410 that alternate between the second and first rows, and finally four consecutive channel portions 1410 in the second row (including the last portion 1410B (solid circle) that is adjacent to the outlet 1408). The coolant channel 1400A therefore includes sixteen portions 1410 that extend substantially across the airflow 1401 (including the first and last portions or tubes 1410A, 1410B). In contrast, the second coolant channel 1400B fed by the inlet manifold 1402 (i.e., in the direction of the coolant flow) includes four consecutive channel portions 1410 in a first row (including the first portion 1410A (solid circle)), followed by four channel portions 1410 that alternate between the second and the first rows, and finally four consecutive channel portions 1410 in the second row (including the last portion 1410B (solid circle)) adjacent to the outlet 1408). The second coolant channel 1400B therefore includes twelve portions 1410 that extend substantially across the airflow 1401 (including the first and last portions 1410A, 1410B). Thus, not only does the pattern of the channel portions 1410 that extend across the airflow 1401 differ, the number of channel portions 1410 extending across the airflow 1401 differ between the first and second coolant channels 1400A, 1400B.

In particular, the length of the flow path of the coolant from the inlet 1406 to the outlet 1408 of the first coolant channel 1400A is longer than that of the second coolant channel 1400B. Similar to the first and second coolant channels 1400A, 1400B, the last coolant channel (or circuit) 1400Z fed by the coolant inlet manifold 1402 includes a different pattern of channel portions 1410 that extend across the airflow 1401, and has (by way of example) two less channel portions 1410 than a second to last coolant channel 1400Y fed by the coolant inlet manifold 1402.

Advantageously, by decreasing the length of the coolant channels with progression up the heat exchanger core, that is, up the manifolds, or more particularly, where the channels couple to the coolant inlet and outlet manifolds, a more uniform coolant flow through the heat exchanger is achieved. By way of specific example, first coolant channel 1400A might comprise 16 passes per circuit, second coolant channel 1400B might comprise 14 passes per circuit, as might the second to last coolant channel 1400Y, and the last coolant channel might comprise 12 passes. In alternate embodiments, two or more of the first cooling channels (or circuits) might comprise 16 passes, and two or more of the last cooling channels might comprise 12 passes. Additionally, note with respect to the heat exchanger embodiments described herein, that there is advantageously counter-flow cooling. That is, assuming that airflow 1401 passes left-to-right across the heat exchanger, from a first side to a second side of the heat exchanger, then multiple coolant channels of the plurality of coolant channels are configured to direct coolant from a channel inlet disposed closer to the second side of the heat exchanger to a channel outlet disposed closer to the first side of the heat exchanger, and thereby provide the counter-flow cooling of the airflow. More particularly, the airflow generally moves left-to-right in this example, and the coolant generally moves (in addition to upwards) right-to-left. Note that this particular counter-flow arrangement of FIGS. 14-16 is presented by way of example only. Further, those skilled in the art will note that the embodiments of FIGS. 15 & 16 generally have better counter-flow cooling than the embodiment of FIG. 14.

As illustrated by the break between the upper and lower halves of FIG. 14, second coolant channel 1400B fed by inlet manifold 1402 and the second to last coolant channel 1400Y fed by the inlet manifold 1402, the plurality of coolant channels 1400 may include any number, configuration or length of channels therebetween. For example, the second coolant channel 1400B may be repeated, which as depicted, is identical to the second to last coolant channel 1400Y. As another example, other coolant channels of differing lengths, arrangements, combinations or patterns may be positioned between coolant channel 1400B and coolant channel 1400Y. In one embodiment, the channels or circuits positioned between the coolant channels 1400B, 1400Y in the direction of the coolant flow path may be configured such that a majority of the first channel portions 1410A of the plurality of coolant channels 1400 fed by the inlet manifold 1402 are positioned in the same column. For example, most, if not all of the first channel portions 1410A fed by the inlet manifold 1402 may be positioned in the same column.

FIG. 15 is a side elevational view of a portion of a plurality of cooling channels 1500 with an airflow 1501 passing thereacross, traveling (by way of example only) substantially left-to-right (as indicated by the arrow). The plurality of cooling channels 1500 are substantially similar to the plurality of cooling channels 1400 described above with respect to FIG. 14, and therefore like reference numerals preceded by "15", as opposed to "14" are used to indicate like elements. One of the differences between the plurality of cooling channels 1500 and the plurality of cooling channels 1400 (FIG. 14) is the number of rows transverse to the direction of the airflow 1501 that channel portions 1510 passing across airflow 1501 are arranged. As shown in FIG. 15, the plurality of cooling channels 1500 include three rows of tube portions 1510 extending perpendicular (by way of example only) to the airflow 1501.

Another difference between the plurality of cooling channels 1500 and the plurality of cooling channels 1400 (FIG. 14) is the difference in lengths of first coolant channel 1500A and second coolant channel 1500B. As shown in FIG. 15, the first coolant channel 1500A includes two more channel portions 1510 that extend across the airflow 1501 compared with the second coolant channel 1500B. Therefore, the length of the coolant flow path from the inlet 1506 to the outlet 1508 of the first coolant channel 1500A is longer than that of the second coolant channel 1500B.

FIG. 16 is a side elevational view of a portion of a plurality of cooling channels 1600 with an airflow 1601 passing across the plurality of cooling channels 1600 traveling (by way of example only) substantially left-to-right (as indicated by the arrow). The plurality of cooling channels 1600 are substantially similar to the plurality of cooling channels 1400 described above with respect to FIG. 14 and the plurality of cooling channels 1500 described above with respect to FIG. 15, and therefore like reference numerals preceded by "16", as opposed to "15" or "14", are used to indicate like aspects. One of the differences between the plurality of cooling channels 1600 and the plurality of cooling channels 1500 (FIG. 15) or 1400 (FIG. 14) is the number of rows transverse to the direction of airflow 1601 that the tube portions 1610 that pass across the airflow 1601 are arranged. In the embodiment of FIG. 16, the plurality of cooling channels 1600 include four rows of tube portions 1610 (i.e., when viewed in top plan view).

Another difference between the heat exchanger embodiments of FIGS. 14-16 is the length of the first coolant channel 1600A and the second coolant channel 1600B. As shown in FIG. 16, the first coolant channel 1600A includes four additional tube portions 1610 that extend across the airflow 1601 compared with the second coolant channel 1600B. Therefore, the length of the flow path of the coolant from inlet 1606 to outlet 1608 of the first coolant channel 1600A is longer than that of the second coolant channel 1600B.

As noted above, the heat exchanger door, air-to-coolant heat exchanger, heat exchanger core and the like may be optimized for one or more metrics, such as one or more performance metrics. Numerous parameters, aspects or characteristics of the heat exchanger door, air-to-coolant heat exchanger and/or heat exchanger core play a role in the metrics thereof (performance or otherwise). Further, these numerous parameters may affect metrics differently at different operating conditions. As such, a method for determining parameters of a heat exchanger that optimize particular metrics of the heat exchanger at particular operating conditions is believed valuable, and is disclosed hereinbelow.

Figure 17:
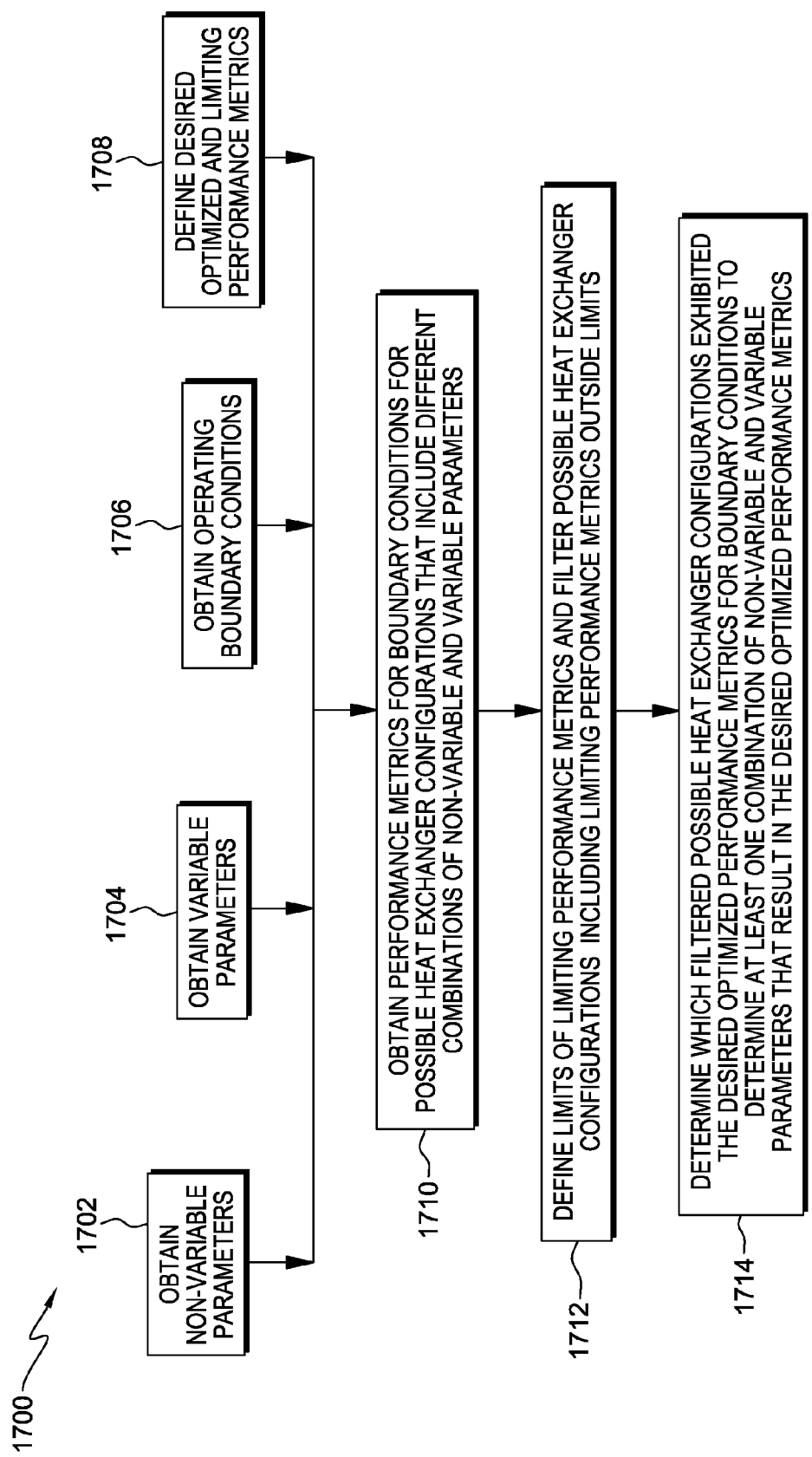
FIG. 17 depicts a flowchart of one embodiment of a process for determining a combination of parameters that optimize at least two performance metrics of a heat exchanger, in accordance with one or more aspects of the present invention.

FIG. 17 depicts one such method 1700 for determining parameters of a heat exchanger that optimizes one or more metrics of the heat exchanger for particular boundary or operating conditions.

As illustrated in FIG. 17, an initial step in the process includes obtaining non-variable parameters 1702 of the heat exchanger. This step may include recording, selecting, identifying, inputting or otherwise establishing the non-variable parameters of the to-be-optimized heat exchanger. For example, if the heat exchanger is an air-to-coolant heat exchanger, such as described herein, then the non-variable parameters may be parameters that are fixed, difficult to alter or are otherwise held constant. In one embodiment, one or more non-variable parameters of the heat exchanger may be one or more of the heat exchanger core width, heat exchanger core height, the material or materials (e.g., material properties) of the inlet and/or outlet manifolds of the heat exchanger, the material comprising the structures that define the coolant channels of the heat exchanger, and the material that defines the fins of the heat exchanger. In certain embodiments, a non-variable parameter may comprise numerical or other discrete, manipulatable data corresponding to a parameter (such as the numerical material properties of copper (e.g., the density of copper, the thermal coefficient of copper, the cost of copper, etc.)).

Another initial step includes obtaining variable parameters 1704 of the heat exchanger. This obtaining variable parameters 1704 of the "to-be-optimized" heat exchanger may include recording, selecting, identifying, inputting or otherwise establishing one or more variable parameters of the heat exchanger. For example, if the heat exchanger is an air-to-coolant heat exchanger, then the variable parameters may be parameters that are customizable, optional, relatively easy to alter or are otherwise selectively held or believed to be flexible or unfixed. In one embodiment, the one or more variable parameter of a heat exchanger may comprise one or more of the inlet and/or outlet manifold cross-sectional dimensions or area (inner and/or outer) in the direction of the coolant flow, the outer and/or inner cross-sectional dimensions of the coolant channels in the direction of coolant flow, the number of columns of coolant channels in the transverse direction of airflow, the depth of the heat exchanger in the direction of airflow, the type of finstock, the thickness of the finstock, the fin pitch and the finstock tube definition, etc. In certain embodiments, the finstock tube definition is defined, as least in part, by the vertical and horizontal (e.g., airflow) directional spacing of the coolant channels that span the airflow (and/or airflow opening). In some embodiments, the finstock tube definition may include the number of distinct channels or circuits, the total number of coolant carrying channels extending across the airflow, or width of the exchanger door, for example, and the number of coolant carrying channel portions extending across the airflow. Like with the non-variable parameters, in certain embodiments, the variable parameters may be defined as numerical or other discrete, manipulatable data corresponding to the parameter(s).

Figure 18:
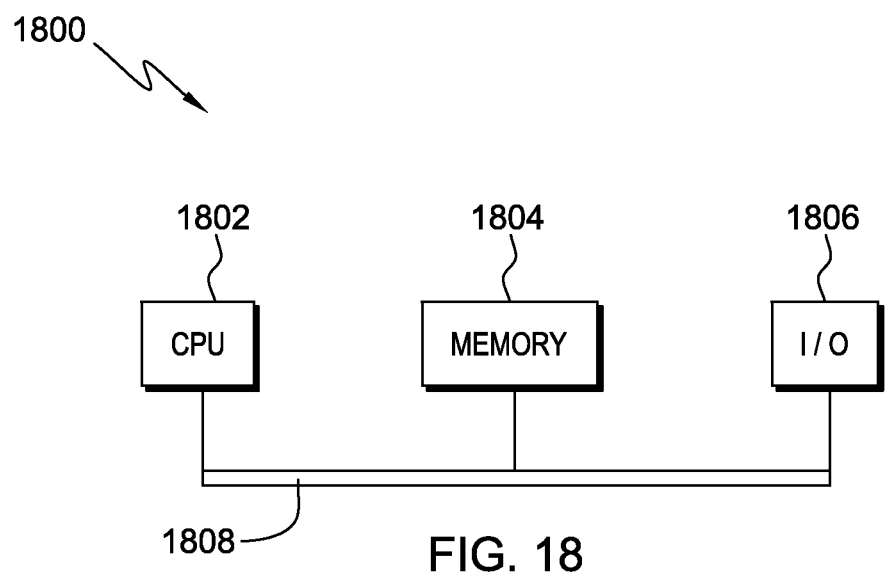
FIG. 18 depicts one example of a computing environment to implement one or more aspects of the present invention.

In one embodiment, data corresponding to the non-variable parameters and the variable parameters is obtained by a computer, such as computer 1800 depicted in FIG. 18. Computer 1800 may include a central processing unit (CPU) 1802, memory 1804, input/output devices or interfaces 1806 and a system bus 1808 interconnecting the components. In certain embodiments, the optimization method disclosed herein may include utilizing one or more input/output devices 1806 of the computer 1800 to input the variable and non-variable parameters, and/or data corresponding thereto.

Another preliminary step in the process includes obtaining boundary conditions 1706 in which the heat exchanger will need to operate within. By way of example, the boundary conditions may be conditions relating to a system in which the heat exchanger is to be installed. As another example, the boundary conditions may be specified minimum, maximum, or like conditions the heat exchanger is to encounter in use. The step of obtaining boundary conditions 1706 may include recording, selecting, identifying, inputting or otherwise establishing boundary conditions for the to-be-optimized heat exchanger. For example, if the heat exchanger is an air-to-coolant heat exchanger, the boundary conditions may be one or more of a temperature of the airflow passing across the heat exchanger, the volumetric flow rate of the airflow across the heat exchanger, the temperature of the coolant entering the heat exchanger, the volumetric flow rate of the coolant received by the heat exchanger and/or the heat load of the environment in which the heat exchanger is installed, etc. The heat load (including heat loss, or heat gain) may be the amount of cooling (heat gain) needed to maintain a desired temperature.

In certain embodiments, several boundary conditions may be obtained. For example, the boundary conditions may represent the likely worst case scenario of conditions for the heat exchanger (i.e., the harshest condition or conditions), the likely best case scenario of conditions for the heat exchanger, the likely typical conditions for the heat exchanger and conditions therebetween. As another example, a series of boundary conditions may be obtained wherein the individual boundary conditions differ. As described above with respect to the non-variable and variable parameters, the boundary conditions may be defined as numerical or other discrete, manipulatable data.

A further step in the process includes defining desired optimized and limiting performance metrics 1708 of the heat exchanger. The performance metrics may be measureable characteristics, capabilities, conditions or the like related to the functioning of the heat exchanger. The desired optimized performance metrics may be the performance metrics of the heat exchanger which the non-variable and variable parameters optimize, and the limiting performance metric may be used to narrow the potential combinations of non-variable and variable parameters.

Defining the desired optimized and limiting performance metrics 1708 may include recording, selecting, identifying, inputting or otherwise establishing one or more desired optimized and limiting performance metrics of the heat exchanger. For example, if the heat exchanger is an air-to-coolant heat exchanger, the desired optimized performance metrics and the limiting performance metrics for a particular boundary condition may be one or more of heat removal of the heat exchanger, air side pressure drop of the airflow flowing across the heat exchanger, coolant side pressure drop of coolant passing through the heat exchanger, core weight of the heat exchanger, or one or more metrics relating to the flow distribution between coolant channels of the heat exchanger. In one embodiment, the desired optimized (or to-be-optimized) performance metrics comprise the heat removal of the heat exchanger and the air side pressure drop of the airflow across the heat exchanger. In such an embodiment, the heat removal rate and air side pressure drop are optimized by selecting a combination of variable and non-variable parameters for the boundary conditions that lead to a maximum heat removal with a minimum air side pressure drop. In certain embodiments, the limiting performance metrics may comprise the core (or total) weight of the heat exchanger, the water side pressure drop of the coolant passing through the heat exchanger or one or more metrics relating to the flow distribution between coolant channels of the heat exchanger. as with the above parameters, the desired optimized and limiting performance metrics may be defined as numerical or other discrete, measurable data.

Once the non-variable parameters, variable parameters and boundary conditions are obtained, and the optimized and limiting performance metrics are defined, the performance metrics may be obtained 1710 for possible heat exchanger configurations for the boundary condition(s) with differing combinations of the variable and non-variable parameters.

The performance metrics for the possible heat exchanger configurations with differing combinations of the variable and non-variable parameters for each boundary condition may be obtained, at least in part, through the use of a computer, such as computer 1800 of FIG. 18. For example, the processor may be programmed to utilize the different combinations of the variable and non-variable parameters and the boundary conditions of the possible heat exchangers to derive the performance metrics for multiple (or even each) parameter and boundary condition combination. As another example, the performance metrics for the possible heat exchanger configurations for each boundary condition may be obtained, at least partially, from external the computer (e.g., by another computer, by a $3^{rd}$ party, experimentally, etc.) and provided to the computer and/or fetched by the computer. In some embodiments, the performance metrics for the possible heat exchanger configurations for the boundary conditions may be obtained sequentially. For example, in certain embodiments, the performance metrics for the possible heat exchanger configurations for a first boundary condition may be determined, then for a second boundary condition, and so on. In another example, the performance metrics for a first possible heat exchanger configuration for the boundary conditions may be determined, then a second possible heat exchanger configuration for the conditions, and so on.

Continuing with FIG. 17, in addition to defining 1708 and obtaining 1710 the performance metrics for the possible heat exchanger configurations with differing combinations of the variable and non-variable parameters for each boundary condition, secondary determinative or instructive performance metrics for the possible heat exchanger configurations for each boundary condition may also be defined and obtained. Similar to the performance metrics, the secondary performance metrics for the possible heat exchanger configurations may include the heat removal rate of the heat exchanger, the air side pressure drop of airflow flowing across the heat exchanger, the coolant side pressure drop of coolant passing through the heat exchanger, core weight of the heat exchanger and one or more metrics relating to the flow distribution of the coolant flow between coolant channels of the heat exchanger. In certain embodiments, the secondary performance metrics may be defined and obtained in any of the ways that the performance metrics are defined and obtained, such as those discussed above.

Once a performance metric of a possible heat exchanger configuration is obtained, the possible heat exchanger configuration may be filtered or analyzed 1712 with respect to an acceptable threshold or limit of the limiting performance metric, as shown in FIG. 17. In one embodiment which includes the coolant side pressure drop as a limiting performance metric, the acceptable threshold or limit of the coolant side pressure drop may be the pressure drop limit of particular connections, such as quick connections to the inlet and/or outlet manifolds, at a particular coolant flow rate. This limiting performance metric may be used to filter unacceptable or unwanted possible heat exchanger configurations from the pool of possible heat exchanger configurations used to determine the optimized parameters. For example, if the performance metrics of a heat exchanger configuration are obtained, and are not within the acceptable threshold for the limiting performance metric, then the heat exchanger configuration can be eliminated from consideration. In this way, the limiting performance metrics and the associated acceptable thresholds can be used in a filtering step that streamlines the method 1700. A computer may be used to perform, at least in part, the comparing the performance metrics with the corresponding acceptable limits and/or the filtering of the possible heat exchanger configurations that include a performance metric outside of the acceptable limit for at least one boundary condition.

Once the desired performance metrics for the possible heat exchanger configurations for each boundary condition are obtained, and the possible heat exchanger configurations are filtered based on the limiting performance metrics, the step of determining 1714 which of the possible heat exchanger configurations optimizes the at least two performance metrics for the boundary conditions can be performed to determine at least one combination of the non-variable and variable parameters that optimize the performance metrics for the heat exchanger.

In certain embodiments, several features of the possible heat exchanger configurations may be utilized to determine which configuration optimizes the desired performance metrics for the boundary conditions. For example, the maximization of a first desired performance metric in combination with the minimization of a second desired performance metric may be preferable. In such embodiments, the combination of non-variable and variable parameters that resulted in the best possible heat exchanger that maximizes the first desired performance metric and minimizes the second desired performance metric for the boundary conditions may be determined. As noted, in one embodiment, the heat removal may be desired to be maximized and the air side pressure drop minimized. The particular weight given to each desired optimized performance characteristic may vary and depend on a host of considerations.

In certain embodiments, additional performance metrics above the limiting and desired optimized performance metrics may be utilized or considered in determining which heat exchanger parameter configuration best optimizes the defined performance metrics for the boundary conditions. For example, the secondary performance metrics discussed above may be utilized or considered in addition to the limiting and desired optimized performance metrics. In such embodiments, one or more of the secondary performance metrics may be the same as one or more of the limiting performance metrics. For example, although a particular limiting performance metric of a possible heat exchanger configuration was within the corresponding threshold of the limiting performance metric, and therefore the possible heat exchanger configuration was not "filtered out" of consideration, the limiting performance metric may be used as a secondary performance metric in determining which heat exchanger parameter configuration optimizes the desired performance metrics for the boundary conditions. Therefore, in such embodiments, the optimization method may, in essence, be determining which heat exchanger parameter configuration optimizes the desired performance metrics and one or more additional secondary performance metrics for the boundary conditions.

In certain embodiments, consideration or use of at least one secondary performance metric may be considered an additional step, or part of the step, of determining a heat exchanger parameter configuration (i.e., combination of variable and non-variable parameters) that optimizes the desired performance metrics for the boundary conditions. As an example, the combination of non-variable and variable parameters that resulted in the possible heat exchanger that maximized the heat removal performance metric, minimized the air pressure drop performance metric and minimized at least one of weight, or cost of the heat exchanger, or heat exchanger core depth, for the boundary conditions may be determined as the combination of the non-variable and variable parameters (i.e., heat exchanger parameter configuration) that optimizes the desired performance metrics for the boundary conditions of a heat exchanger. The particular weight given to each desired performance characteristic and secondary performance metric may vary and depend on a host of considerations. For example, a first heat exchanger parameter configuration achieving 1% more heat removal than a second heat exchanger parameter configuration may not be deemed "optimized" over the second heat exchanger parameter configuration if it is considerably more expensive, heavy or thicker than the second heat exchanger parameter configuration.

In one embodiment, one or more computers (such as the computer 1800 of FIG. 18) may be used in, at least in part, determining 1714 (FIG. 17) which heat exchanger parameter configuration(s) (i.e., combination of variable and non-variable parameters) optimizes the desired performance metrics for the boundary conditions. For example, the computer may obtain the performance metrics and the secondary performance metrics for the different heat exchanger parameter configurations for each boundary condition and, based thereon, determine the heat exchanger parameter configuration that best optimizes the performance metrics, for example, in consideration of any secondary performance metrics, for the boundary conditions.

Figure 19:
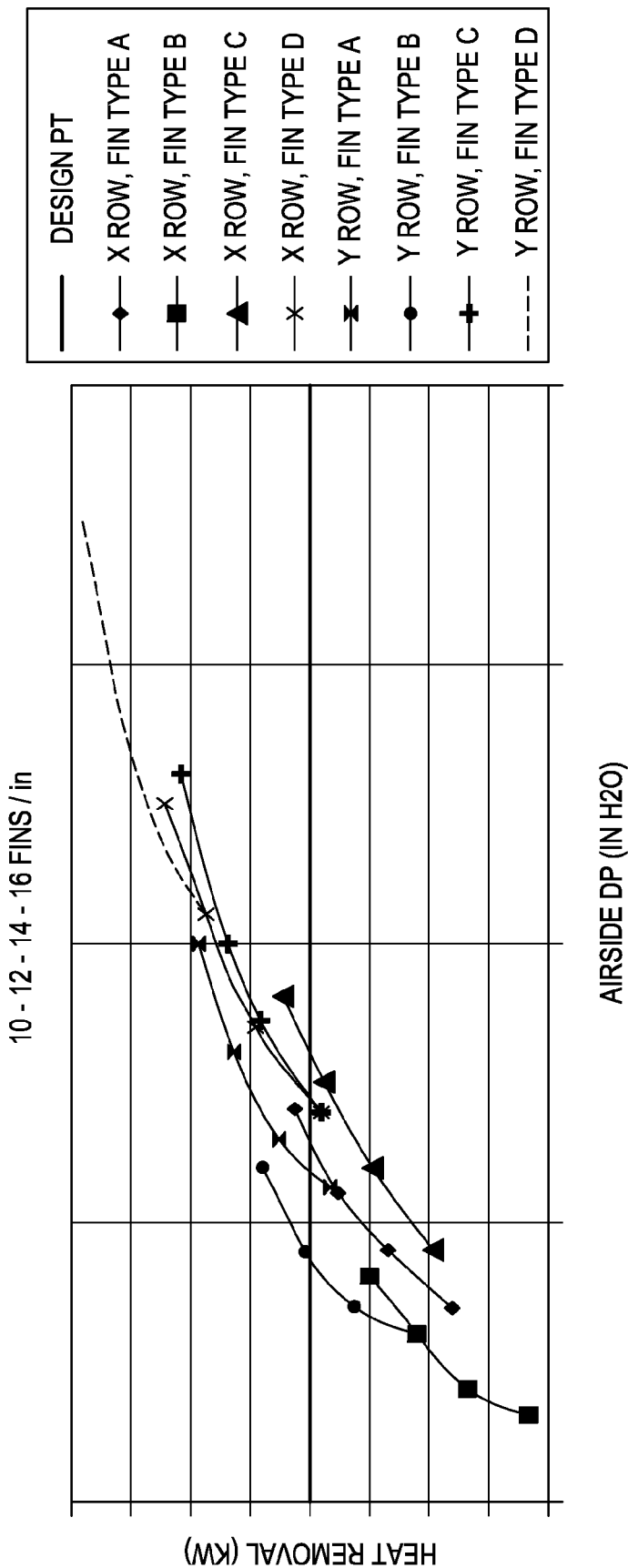
FIG. 19 is a visual representation of performance metrics and heat exchanger parameters for different heat exchanger configurations with differing combinations of parameters, in accordance with one or more aspects of the present invention.

By way of further example, shown in FIG. 19, a computer may obtain the possible heat exchanger parameter configurations and the performance metrics thereof for one or more boundary conditions, and any other requisite or relevant data, and produce one or more visual indications (e.g., graphs) of the relationship of the different combinations of the non-variable and variable parameters and the at least two performance metrics of the possible heat exchangers in the boundary condition. In the example shown in FIG. 19, a graph displays the performance metrics (e.g., heat removal and air side pressure drop) and the variable parameters (fin type, number of rows of coolant channels in the airflow direction) differ from the eight designs. The variable parameter fin densities are indicated by the four symbols of each line indicating the different parameter configurations, with 10 fins/in being the symbol in the lower left and 16 fins/in being the symbol in the upper right. Other parameters besides the variable parameters of the heat exchanger configurations were assumed to be fixed (i.e., non-variable parameters) in this illustration.

The graph of FIG. 19 can assist a designer in determining which combination of variable parameters (fin type, number of rows of coolant channels in the airflow direction and fin density) and non-variable parameters best maximize, for example, heat removal while minimizing air side pressure drop (i.e., optimize the desired performance metrics) for a particular boundary condition. In this way, charts like that of FIG. 19 can be created for each boundary condition, and the charts for each boundary condition can be used together to determine which combination of non-variable and variable parameters optimizes heat removal and air side pressure drop (i.e., maximizes heat removal and minimizes air side pressure drop) for the boundary conditions.

Figure 20A:
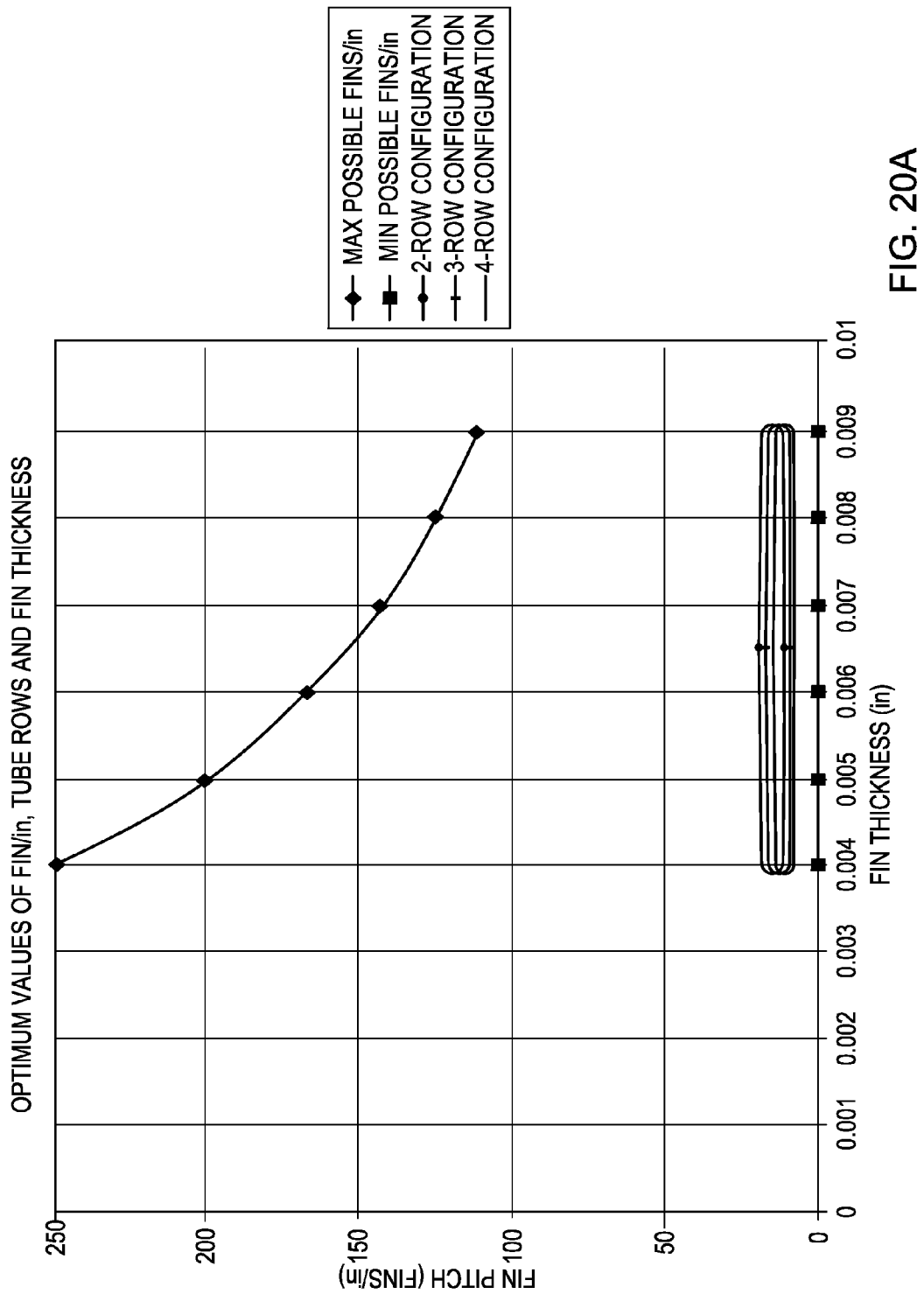
FIGS. 20A & 20B are a visual representation of optimum fin parameters for heat exchanger configurations with differing numbers of rows of coolant channels, in accordance with one or more aspects of the present invention.
Figure 20B:
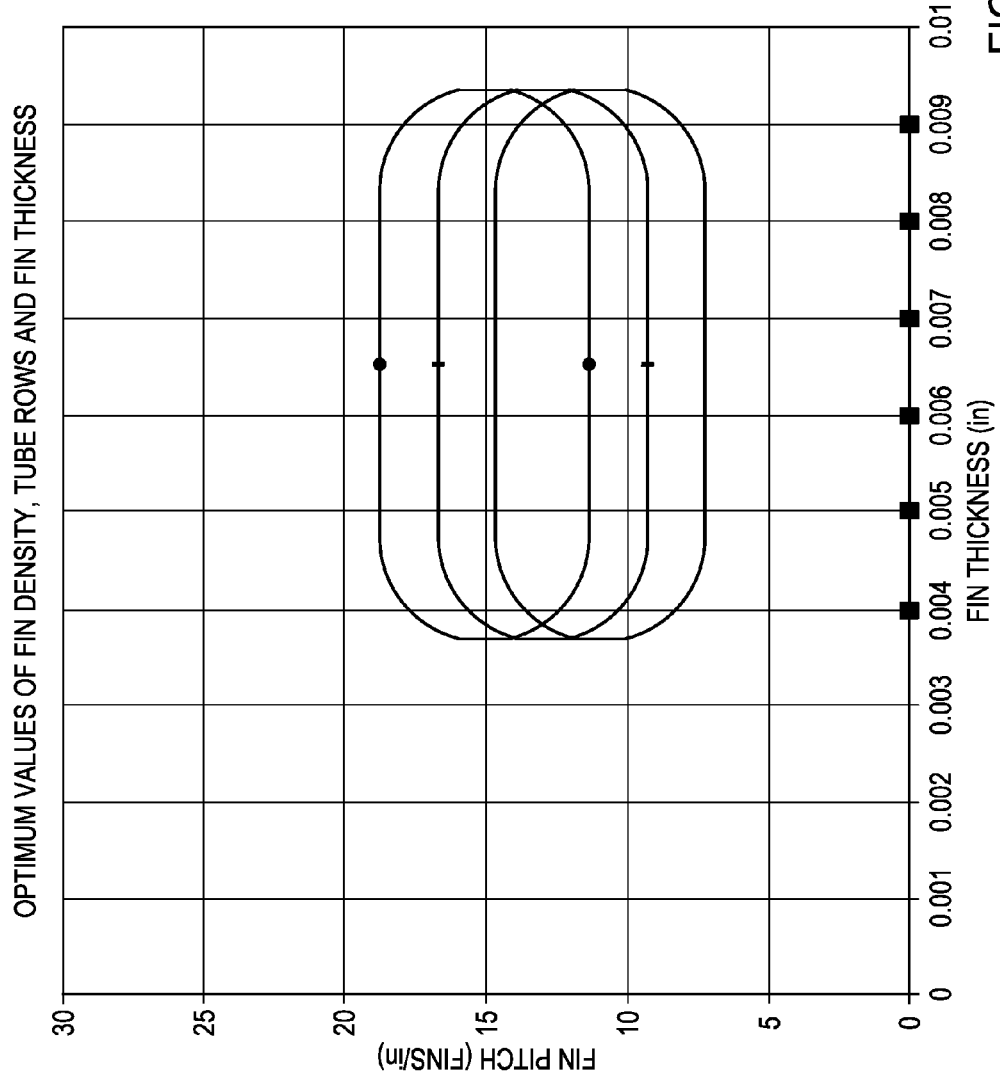

FIGS. 20A & 20B depict another example of a graph useful in determining a combination of variable and non-variable parameters of a heat exchanger that optimize performance metrics for given boundary conditions. In these figures, wherein FIG. 20B is a partially enlarged version of FIG. 20A, the optimum values of fins/inch and fin thicknesses are illustrated for heat exchangers with a particular number of rows of coolant channels in the airflow direction for different combinations of variable and non-variable parameters. The graph of FIGS. 20A & 20B can be constructed using data from the optimization method described above, or portions thereof. For example, the optimization method can be used to obtain the fin density and fin thickness for optimized heat exchanger configurations with a particular number of coolant channel columns in the airflow direction in combination with differing variable parameters. These fin densities and fin thicknesses can therefore be considered optimized fin densities and fin thicknesses. The maximum and minimum optimized fin densities and fin thicknesses can be plotted on a graph to show the boundaries of the optimized fin densities and thicknesses for the heat exchanger configurations with a particular amount of coolant channel rows transverse the airflow direction. Any combination of fin density and fin thickness lying within the boundary is there an optimized fin density and fin thickness (i.e., an optimized parameter) of the heat exchanger with that particular number of coolant channel columns transverse the airflow direction (and the combination of non-variable and variable parameters used to create the graph). This process can be repeated for heat exchanger configurations with different amounts of coolant channel columns transverse to the airflow direction, such as shown in FIGS. 20A & 20B. Thereby, the graph of FIGS. 20A & 20B can be used to conjointly select an optimized combination of number of columns of coolant channels transverse the airflow direction, fin density, and fin thickness (i.e., conjointly select parameters that optimize particular performance metrics) of the heat exchanger.

Those skilled in the art should note that one or more of the above-described steps, or a portions thereof, may be performed or completed without the aid of a computer. In one embodiment, one or more of the above-described steps, or portions thereof, may be performed physically. For example, at least one of the performance metrics (desired, limiting, secondary, etc.) of the differing combinations of the variable and non-variable parameters for the boundary conditions may be determined experimentally.

Further, as will be appreciated by one skilled in the art, control aspects of the present invention may be embodied as a system, method or computer program product. Accordingly, aspects of the present invention may take the form of an entirely hardware embodiment, an entirely software embodiment (including firmware, resident software, microcode, etc.) or an embodiment combining software and hardware aspects that may all generally be referred to herein as a "circuit," "module" or "system". Furthermore, control aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable signal medium may be any non-transitory computer readable medium that is not a computer readable storage medium and that can communicate, propagate, or transport a program for use by or in connection with an instruction execution system, apparatus or device.

A computer readable storage medium may be, for example, but not limited to, an electronic, magnetic, optical, electromagnetic, infrared or semiconductor system, apparatus, or device, or any suitable combination of the foregoing.

More specific examples (a non-exhaustive list) of the computer readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

In one example, a computer program product may include, for instance, one or more computer readable storage media to store computer readable program code means or logic thereon to provide and facilitate one or more aspects of the present invention.

Program code embodied on a computer readable medium may be transmitted using an appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language, such as Java, Smalltalk, C++ or the like, and conventional procedural programming languages, such as the "C" programming language, assembler or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In addition to the above, one or more aspects of the present invention may be provided, offered, deployed, managed, serviced, etc. by a service provider who offers management of customer environments. For instance, the service provider can create, maintain, support, etc. computer code and/or a computer infrastructure that performs one or more aspects of the present invention for one or more customers. In return, the service provider may receive payment from the customer under a subscription and/or fee agreement, as examples. Additionally or alternatively, the service provider may receive payment from the sale of advertising content to one or more third parties.

In one aspect of the present invention, an application may be deployed for performing one or more aspects of the present invention. As one example, the deploying of an application comprises providing computer infrastructure operable to perform one or more aspects of the present invention.

As a further aspect of the present invention, a computing infrastructure may be deployed comprising integrating computer readable code into a computing system, in which the code in combination with the computing system is capable of performing one or more aspects of the present invention.

As yet a further aspect of the present invention, a process for integrating computing infrastructure comprising integrating computer readable code into a computer system may be provided. The computer system comprises a computer readable medium, in which the computer medium comprises one or more aspects of the present invention. The code in combination with the computer system is capable of performing one or more aspects of the present invention.

Although various embodiments are described above, these are only examples. For example, computing environments of other architectures can incorporate and use one or more aspects of the present invention. Additionally, the network of nodes can include additional nodes, and the nodes can be the same or different from those described herein. Also, many types of communications interfaces may be used.

Further, a data processing system suitable for storing and/or executing program code is usable that includes at least one processor coupled directly or indirectly to memory elements through a system bus. The memory elements include, for instance, local memory employed during actual execution of the program code, bulk storage, and cache memory which provide temporary storage of at least some program code in order to reduce the number of times code must be retrieved from bulk storage during execution.

Input/Output or I/O devices (including, but not limited to, keyboards, displays, pointing devices, DASD, tape, CDs, DVDs, thumb drives and other memory media, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems, and Ethernet cards are just a few of the available types of network adapters.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to explain the principles of the invention and the practical application, and to enable others of ordinary skill in the art to understand the invention through various embodiments and the various modifications thereto which are dependent on the particular use contemplated.

What is claimed is:

1. An apparatus comprising:
a heat exchanger door that couples to an electronics rack and resides at one of an air inlet side or an air outlet side of the electronics rack, the heat exchanger door comprising an airflow opening, the airflow opening facilitating the ingress or egress of airflow through the electronics rack with the heat exchanger door mounted thereto, wherein the heat exchanger door comprises:
an air-to-coolant heat exchanger disposed so that airflow through the airflow opening passes across the air-to-coolant heat exchanger from a first side to a second side thereof, the air-to-coolant heat exchanger to extract heat from the airflow passing thereacross, and comprising a plurality of coolant channels which extend substantially across the airflow opening at least once, wherein the plurality of coolant channels include a last coolant channel coupled to receive coolant from a coolant supply manifold downstream from a first coolant channel receiving coolant from the coolant supply manifold, and wherein a number of channel portions that extend substantially across the airflow opening for the last coolant channel coupled to the coolant supply manifold is less than a number of channel portions that extend substantially across the airflow opening for the first coolant channel coupled to the coolant supply manifold independent of the last coolant channel.

2. The apparatus of claim 1, wherein the plurality of coolant channels include at least one intermediate coolant channel that receives coolant from the coolant supply manifold before the last coolant channel and after the first coolant channel, and wherein a number of channel portions that extend substantially across the airflow opening for the at least one intermediate coolant channel is less than the number of channel portions that extend substantially across the airflow opening for the first coolant channel and greater than the number of channel portions that extend substantially across the airflow opening for the last coolant channel.

3. The apparatus of claim 2, wherein the plurality of coolant channels comprises multiple intermediate coolant channels that extend substantially across the airflow opening an equal number of times, and wherein each of the multiple intermediate coolant channels partially overlap with another of the multiple intermediate coolant channels with respect to the airflow passing thereacross and wherein the first coolant channel and the last coolant channel do not overlap with respect to the airflow passing thereacross.

4. The apparatus of claim 1, wherein the plurality of coolant channels extend substantially across the airflow opening multiple times, and wherein the first coolant channel and the last coolant channel do not overlap with respect to the airflow passing thereacross.

5. The apparatus of claim 1, wherein the plurality of coolant channels each include an inlet in fluid communication with the coolant supply manifold and an outlet in fluid communication with a coolant return manifold, and wherein channel lengths of the first coolant channel and the last coolant channel are chosen such that the first coolant channel and the last coolant channel intake coolant at a substantially similar coolant flow rate.

6. The apparatus of claim 1, wherein channel lengths of at least three coolant channels of the plurality of coolant channels are different.

7. The apparatus of claim 1, wherein the plurality of coolant channels include channel portions that extend substantially across the airflow opening immediately following channel inlets thereof, and channel portions that extend substantially across the airflow opening immediately preceding channel outlets thereof, and wherein a majority of the channel portions that immediately follow the channel inlets are positioned within the heat exchanger core in a direction of the airflow before the channel portions that immediately precede the channel outlet.

8. The apparatus of claim 1, wherein the first coolant channel and the last coolant channel do not overlap with respect to the airflow passing thereacross.

9. The apparatus of claim 1, wherein the first coolant channel and the last coolant channel each receive coolant from the coolant supply manifold on the second side.

10. The apparatus of claim 1, wherein the first coolant channel and the last coolant channel each receive coolant from the coolant supply manifold on the second side and wherein coolant exits each of the first coolant channel and the last coolant channel into a coolant return manifold on the first side.

11. The apparatus of claim 1, wherein spacing between the channel portions of the first coolant channel differ from spacing between the channel portions of the last coolant channel in a direction of the airflow.

12. The apparatus of claim 1, wherein spacing between the channel portions of the first coolant channel differ from spacing between the channel portions of the last coolant channel in a direction orthogonal of a direction of the airflow.

13. The apparatus of claim 1, wherein spacing between the channel portions of the first coolant channel differ from spacing between the channel portions of the last coolant channel in a direction of the airflow and in a direction orthogonal of the direction of the airflow.

14. The apparatus of claim 1, wherein the first coolant channel and the last coolant channel comprise differing patterns of channel portions that extend substantially across the airflow opening.

15. An apparatus comprising:
a heat exchanger door that couples to an electronics rack, the heat exchanger door comprising an airflow opening, the airflow opening facilitating the ingress or egress of airflow through the electronics rack with the heat exchanger door mounted thereto, wherein the heat exchanger door comprises:
an air-to-coolant heat exchanger disposed so that airflow through the airflow opening passes across the air-to-coolant heat exchanger from a first side to a second side thereof, the air-to-coolant heat exchanger to extract heat from the airflow passing thereacross, the air-to-coolant heat exchanger comprising a plurality of coolant channels which extend substantially across the airflow opening at least once, wherein the plurality of coolant channels include a last coolant channel coupled to receive coolant from a coolant supply manifold downstream from a first coolant channel receiving coolant from the coolant supply manifold,
wherein a number of channel portions that extend substantially across the airflow opening for the last coolant channel coupled to the coolant supply manifold is less than a number of channel portions that extend substantially across the airflow opening for the first coolant channel coupled to the coolant supply manifold independent of the last coolant channel, and
wherein the first coolant channel and the last coolant channel do not overlap with respect to the airflow passing thereacross, and
wherein spacing between the channel portions of the first coolant channel differ from spacing between the channel portions of the last coolant channel in a direction of the airflow and in a direction orthogonal of the direction of the airflow.

16. The apparatus of claim 15, wherein the first coolant channel and the last coolant channel each receive coolant from the coolant supply manifold on the second side and each supply coolant to a coolant return manifold on the first side.

* * * * *